(12) United States Patent
Grek et al.

(10) Patent No.: US 8,731,139 B2
(45) Date of Patent: May 20, 2014

(54) EVAPORATIVE THERMAL MANAGEMENT OF GRAZING INCIDENCE COLLECTORS FOR EUV LITHOGRAPHY

(75) Inventors: Boris Grek, Hayward, CA (US); Daniel Stearns, Los Altos Hills, CA (US); Natale M. Ceglio, Pleasanton, CA (US)

(73) Assignee: Media Lario S.R.L., Bosisio Parini (LC) (IT)

( * ) Notice: Subject to any disclaimer, the term of this patent is extended or adjusted under 35 U.S.C. 154(b) by 418 days.

(21) Appl. No.: 13/136,784

(22) Filed: Aug. 10, 2011

(65) Prior Publication Data
US 2012/0281189 A1 Nov. 8, 2012

Related U.S. Application Data
(60) Provisional application No. 61/518,378, filed on May 4, 2011.

(51) Int. Cl.
G02B 7/195 (2006.01)
G21K 1/06 (2006.01)
H01J 35/16 (2006.01)
H05G 1/02 (2006.01)
G02B 5/08 (2006.01)

(52) U.S. Cl.
USPC .............. 378/85; 378/200; 378/204; 359/845

(58) Field of Classification Search
USPC .............. 378/70, 82, 85, 141, 199, 200, 204, 378/210; 359/838, 845, 850, 851, 871, 883
See application file for complete search history.

(56) References Cited

U.S. PATENT DOCUMENTS

| | | | |
|---|---|---|---|
| 2,350,348 A | 6/1944 | Gaugler | |
| 6,206,531 B1 * | 3/2001 | Williams et al. | 359/883 |
| 6,831,744 B2 * | 12/2004 | Masaki et al. | 356/400 |
| 6,859,259 B2 | 2/2005 | Bakker et al. | |
| 7,002,168 B2 | 2/2006 | Jacob et al. | |
| 7,164,144 B2 | 1/2007 | Partlo et al. | |
| 7,212,274 B2 | 5/2007 | Hara et al | |
| 7,292,307 B2 * | 11/2007 | Kino | 355/30 |
| 7,457,126 B2 | 11/2008 | Ahrens | |

(Continued)

FOREIGN PATENT DOCUMENTS

EP 1 406 124 A1 4/2004
WO WO 2004/042828 A2 5/2004

OTHER PUBLICATIONS

Jansson, "Heat Pipes" QEX, Jul./Aug. 2010, pp. 3-9.

(Continued)

*Primary Examiner* — Anastasia Midkiff
(74) *Attorney, Agent, or Firm* — Opticus IP Law PLLC

(57) ABSTRACT

Evaporate thermal management systems for and methods of grazing incidence collectors (GICs) for extreme ultraviolet (EUV) lithography include a GIC shell interfaced with a jacket to form a structure having a leading end and that defines a chamber. The chamber operably supports at least one wicking layer. A conduit connects the wicking layer to a condenser system that support cooling fluid in a reservoir. When heat is applied to the leading end, the cooling fluid is drawn into the chamber from the condenser unit via capillary action in the wicking layer and an optional gravity assist, while vapor is drawn in the opposite direction from the chamber to the condenser unit. Heat is removed from the condensed vapor at the condenser unit, thereby cooling the GIC mirror shell.

23 Claims, 18 Drawing Sheets

(56) References Cited

U.S. PATENT DOCUMENTS

| | | | |
|---|---|---|---|
| 7,513,651 | B2 | 4/2009 | Chen |
| 7,645,056 | B1 | 1/2010 | Mills et al. |
| 7,938,543 | B2 | 5/2011 | Gerets et al. |
| 8,047,686 | B2 | 11/2011 | Dahm et al. |
| 8,061,032 | B2 | 11/2011 | Banham et al. |
| 8,153,994 | B2 | 4/2012 | Ghislanzoni et al. |
| 8,330,131 | B2 | 12/2012 | Ceglio et al. |
| 8,371,700 | B2 | 2/2013 | Lin et al. |
| 8,390,785 | B2 | 3/2013 | Zocchi et al. |
| 8,529,105 | B2 | 9/2013 | Calon et al. |
| 8,540,497 | B2 | 9/2013 | Chang |
| 8,542,344 | B2 | 9/2013 | Hoogendam et al. |
| 8,550,150 | B2 | 10/2013 | Hou |
| 8,550,650 | B1 | 10/2013 | McGinty |
| 8,569,939 | B2 | 10/2013 | Kim et al. |
| 8,594,277 | B2 | 11/2013 | Zocchi et al. |
| 8,596,073 | B2 | 12/2013 | Zhang |
| 2004/0051984 | A1* | 3/2004 | Oshino et al. .............. 359/845 |
| 2006/0093253 | A1 | 5/2006 | Egle et al. |
| 2006/0131515 | A1 | 6/2006 | Partlo et al. |
| 2006/0196651 | A1 | 9/2006 | Board et al. |
| 2007/0084461 | A1 | 4/2007 | Box et al. |
| 2008/0018876 | A1 | 1/2008 | Stuetzle et al. |
| 2008/0117637 | A1 | 5/2008 | Chang et al. |
| 2009/0153975 | A1 | 6/2009 | O'Reilly et al. |
| 2009/0224182 | A1 | 9/2009 | McGeoch |
| 2010/0096557 | A1 | 4/2010 | Zocchi et al. |
| 2010/0296308 | A1 | 11/2010 | Ohsawa |
| 2011/0075118 | A1 | 3/2011 | Jacobs et al. |
| 2011/0199771 | A1 | 8/2011 | Luu |
| 2011/0232878 | A1 | 9/2011 | Wilhemus et al. |
| 2012/0147349 | A1 | 6/2012 | van Dijsseldonk et al. |
| 2012/0227929 | A1 | 9/2012 | Rose et al. |
| 2013/0228313 | A1 | 9/2013 | Fried |
| 2013/0269913 | A1 | 10/2013 | Ueda et al. |

OTHER PUBLICATIONS

Bianucci et al., "Design and fabrication considerations of EUVL collectors for HVM" Proc. SPIE. 7271, Alternative Lithographic Technologies, 72710C (2009).

Bianucci et al., "Development and performance of grazing and normal incidence collectors for the HVM DPP and LPP sources" Proc. SPIE 7636, Extreme Ultraviolet (EUV) Lithography, 76360C (2010).

Bianucci et al., "Enabling the 22 nm node via grazing incidence collectors integrated into the DPP source for EUVL HVM" Proc. SPIE 7969, 79690B (2011).

Bianucci et al., "Low Co0 grazing incidence collectors for EUVL HVM" Proc. SPIE 8322, Extreme Ultraviolet (EUV) Lithography III, 832216 (2012).

* cited by examiner

EVAPORATIVE THERMAL MANAGEMENT OF GRAZING INCIDENCE COLLECTORS FOR EUV LITHOGRAPHY

CLAIM OF PRIORITY

This application claims the benefit of priority under 35 U.S.C. §119(e) of U.S. Provisional Patent Application Ser. No. 61/518,378, filed on May 4, 2011, which application is incorporated by reference herein.

FIELD

The present invention relates generally to grazing-incidence collectors (GICs), and in particular to systems and methods of evaporative thermal management of GICs used in extreme ultraviolet (EUV) lithography.

BACKGROUND ART

EUV lithography is anticipated to be the lithographic process of choice for producing future generations of semiconductor devices having line widths on the order of 27 nm and smaller. The wavelength of the EUV radiation is nominally 13.5 nm, which calls for the use of specialized optics to collect and image the EUV radiation.

One type of EUV optical system used to collect the radiation from the light source is a grazing incidence collector (GIC). A GIC typically comprises one or more concentrically arranged GIC mirror shells configured to receive radiation from the EUV source at grazing incidence and reflect the received radiation in order to concentrate it at an intermediate focus such that the EUV radiation distribution in the far field is uniform to within a specification set by the overall system optical design.

The radiation sources being considered for EUV lithography include a discharge-produced plasma (DPP) and laser-produced plasma (LPP). The conversion efficiency of these sources is only a few percent so that most of the energy used to generate the EUV radiation is converted to infrared, visible, UV radiation and energetic particles that can be incident upon the one or more GIC mirror shells. This broadband radiation causes a substantial thermal load on the one or more GIC mirror shells.

Consequently, each GIC mirror shell therefore needs to be cooled so that the heat absorbed by the mirror does not substantially adversely affect GIC performance or damage the GIC. In particular, the cooling needs to be carried out under high power loading conditions while preventing distortion of the one or more GIC mirror shells. This is because the uniformity and stability of the illumination of the reflective reticle is a key aspect of quality control in EUV lithography. In particular, the intensity and angular distributions of the EUV radiation delivered by the GIC to the input aperture of the illuminator must not change significantly as the thermal load on the GIC is cycled. This requires a specified degree of radiation uniformity in the far field of the GIC radiation pattern, and this uniformity can be compromised by distortion or figure errors in the GIC mirror shells.

To date, essentially all GICs for EUV lithography have been used in the laboratory or for experimental "alpha" systems under very controlled conditions. As such, there has been little effort directed to GIC thermal management systems for GICs use in a commercially viable EUV lithography system. In fact, the increasing demand for higher EUV power in such commercial systems also increases the thermal load on the GIC. Consequently, more efficient and effective thermal management systems must be implemented for GICs for use in commercial EUV lithography systems to minimize the optical distortion due to the thermal load.

SUMMARY

The disclosed systems for and methods of evaporative thermal management of GIC mirror systems allow cooling under high power loading conditions associated with actual commercial EUV lithography without requiring complex, high-volume plumbing of coolant to the GIC mirrors. The disclosed systems also allow for maintaining a substantially uniform temperature distribution over a large area optical surface, which serves to minimize thermal distortion of the optical surface.

A particular advantage of the evaporative approaches disclosed is that the cooling process is self-regulating; that is, areas of the optical structure that have higher power loading will tend to get warmer, thereby leading to a higher rate of evaporation and therefore a higher cooling rate.

An example evaporative cooling system includes forming a GIC mirror cooling assembly that defines a heat pipe on the outer surface of a GIC mirror shell. Operation of the heat pipe is initiated by heating the GIC mirror shell using broadband radiation emitted from an EUV radiation source. Alternatively, start-up of the heat pipe may be initiated by an external heater configured to initiate the evaporative cooling process even before the EUV radiation source is turned on. The applied heat causes a fluid coolant carried by wicking layers adjacent the heated surfaces to evaporate. The vapor is removed from the GIC mirror outer surface to a condenser system that condenses the vapor. The disclosed system can include a heat and erosion shield to protect the leading edge (closest to the EUV radiation source) of the GIC mirror system.

The heat-pipe configuration provides substantially uniform cooling of the GIC mirror shell over the entire GIC mirror shell while avoiding spatial modulations of the GIC mirror reflective surface that can occur when using networks of cooling lines in thermal contact with the GIC mirror shell. Moreover, the GIC evaporative thermal management systems and methods disclosed herein enable efficient cooling without the need for flowing large amounts of coolant at relatively high flow rates. Further, the evaporative thermal management systems and methods can be implemented in embodiments that add only a few millimeters of width to the GIC mirror shell. This results in a low-profile design that allows for a nested GIC mirror shell configuration with minimal obscuration of the optical pathways between the EUV radiation source and the intermediate focus.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention and together with the description serve to explain the principles and operations of the invention. The claims set forth below constitute part of the detailed description and are incorporated by reference herein into the specification.

Figure 1:
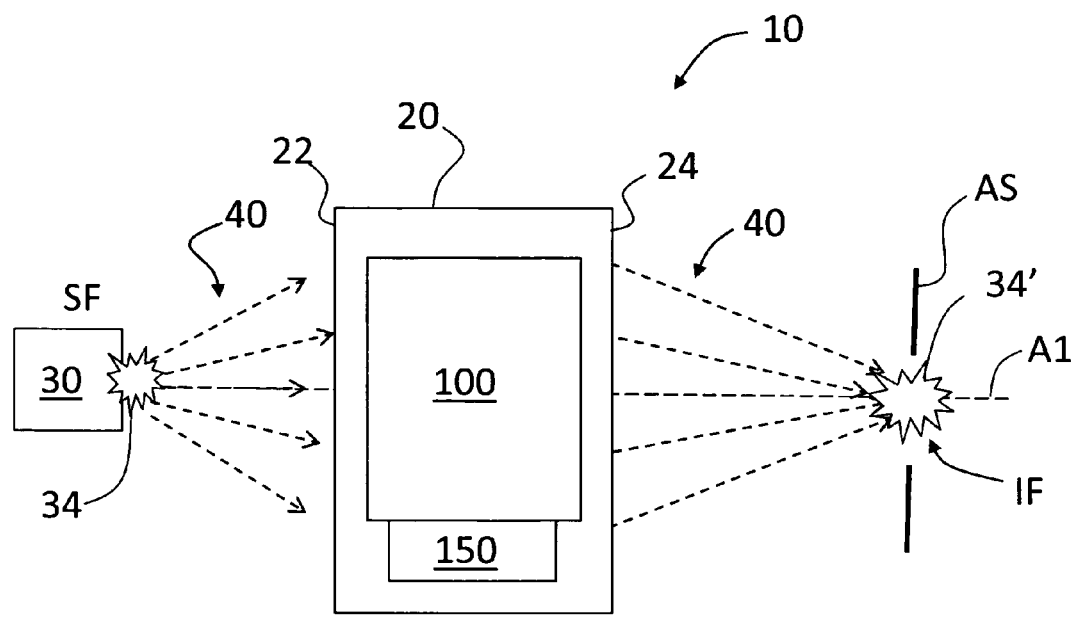
FIG. 1 is schematic diagram of an example EUV source-collector module or SOCOMO that has an axis A1 and that includes a GIC mirror system.

The various elements depicted in the drawing are merely representational and are not necessarily drawn to scale. Certain sections thereof may be exaggerated, while others may be minimized. The drawing is intended to illustrate an example embodiment of the invention that can be understood and appropriately carried out by those of ordinary skill in the art. The orientation of the various elements are selected for ease of illustration and "up" and "down" in the drawings neither necessarily correspond to nor are aligned with the direction of gravity unless specifically indicated.

DETAILED DESCRIPTION

In the discussion below, the term "fluidly connected" and like terms apply to a fluid in both liquid and gaseous (vapor) form. In the Figures, the same or like elements and components are referred to with the same or like reference numbers where convenient.

SOCOMO

FIG. 1 is schematic diagram of an example EUV source-collector module or SOCOMO 10 that has an axis A1 and that includes a GIC mirror system 20 arranged along the central axis. GIC mirror system 20 has an input end 22 for radiation from the EUV source 34 and an output end 24 for radiation leaving the collector and being focused onto the intermediate focus (IF). GIC mirror system 20 also includes a GIC mirror assembly 100 and a GIC mirror thermal management ("cooling") assembly (or "cooling structure") 150 arranged in operative relation thereto, and which are discussed in greater detail below.

SOCOMO 10 includes an EUV radiation source system 30 arranged along axis A1 adjacent GIC mirror system input end 22 and that generates an EUV radiation source 34 at a source focus SF. EUV radiation source 34 emits a 'working band' of EUV radiation 40 having a wavelength of nominally 13.5 nm as well as other out-of-band radiation. Example EUV radiation source systems 30 include laser-produced plasma (DPP) or a discharge-produced plasma (DPP) radiation source 34.

GIC mirror system 20 is configured to receive from EUV radiation source 34 working-band EUV radiation 40 and collect this EUV radiation at an intermediate focus IF adjacent output end 24 and along axis A1, where an intermediate source image 34' is formed. When SOCOMO 10 is incorporated into an EUV lithography system, intermediate focus IF is located at or near an aperture stop AS for an EUV illuminator (see FIG. 18). An example EUV lithography system that uses GIC mirror system 20 is discussed in greater detail below.

GIC Mirror Assembly

Figure 2:
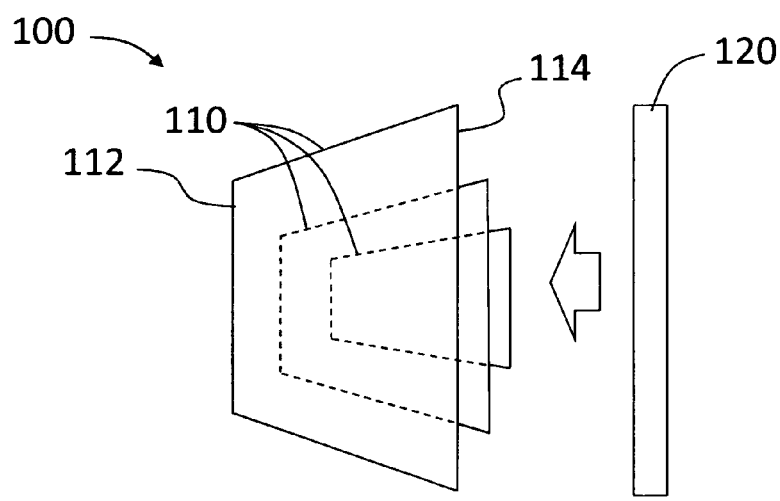
FIG. 2 is schematic side-view diagram of an example GIC mirror assembly that includes one or more GIC mirror shells ("GIC mirror shells")

FIG. 2 is a schematic side-view diagram of an example GIC mirror assembly 100 that includes one or more GIC mirror shells ("GIC mirror shells") 110 each having an input edge 112 at input end 22 and an output edge 114 at output end 24. GIC mirror assembly 100 includes a GIC mirror shell support member 120 (also called a "spider") that supports the GIC mirror shells in a nested and spaced-apart configuration at their output edges 114.

Example GIC mirror assemblies 100 are disclosed in U.S. Patent Application Publication No. 2010/0284511, and in U.S. patent application Ser. No. 12/735,525 and Ser. No. 12/734,829, which are incorporated by reference herein. An example GIC mirror shell support member 120 is disclosed in U.S. patent application Ser. No. 12/657,650, which is incorporated by reference herein.

Figure 3:
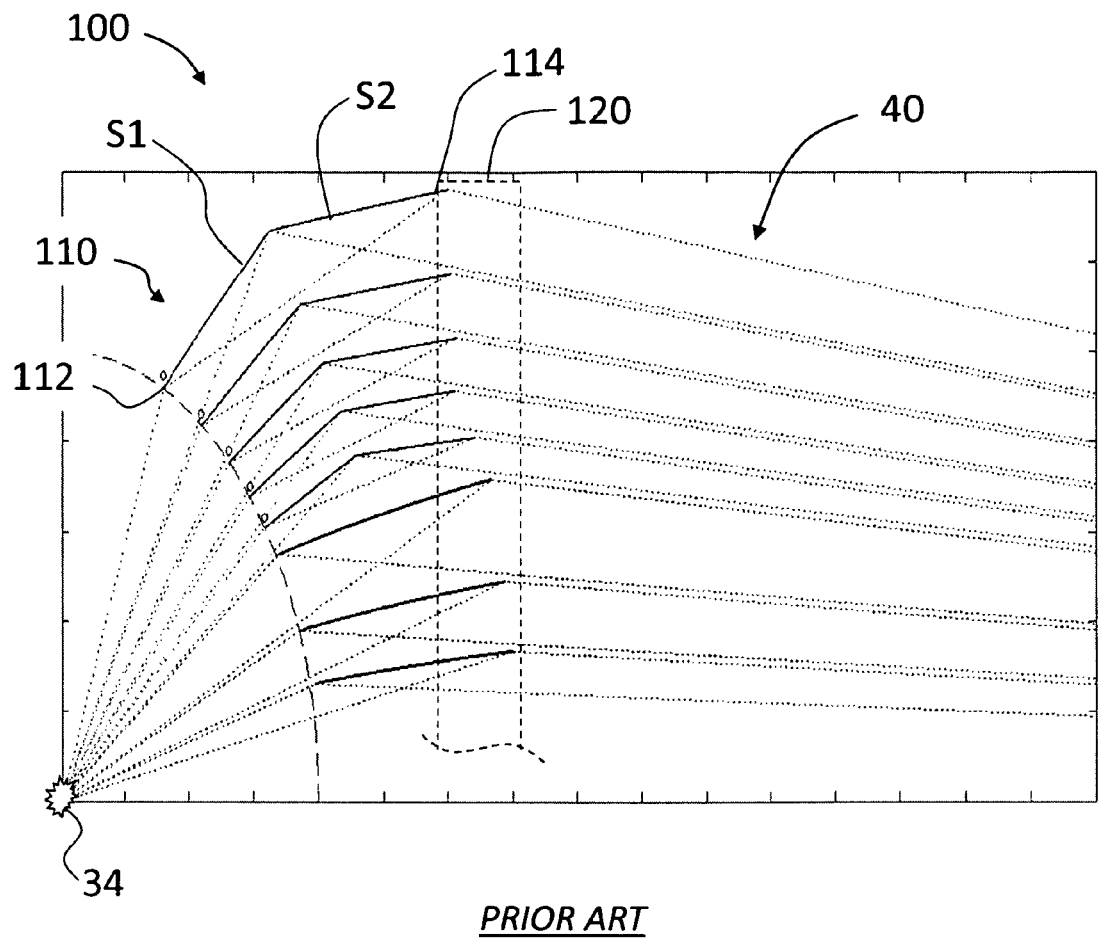
FIG. 3 is a cross-sectional view of a top-portion of an example GIC mirror assembly having eight GIC mirror shells, where the outer five GIC mirror shells include two different shell sections.

FIG. 3 is a cross-sectional view of a top-portion of an example GIC mirror assembly 100 having eight GIC mirror shells 110, where the outer five GIC mirror shells include two different shell sections S1 and S2 having different curvatures and optionally different coatings.

Figure 4:
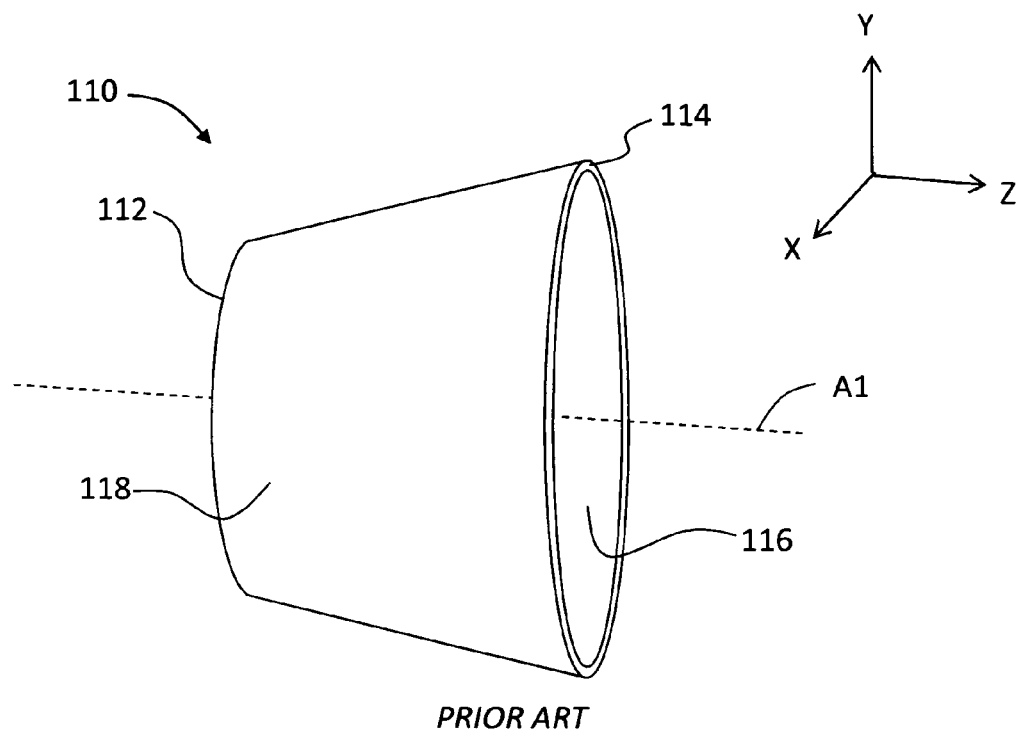
FIG. 4 is an isometric view of an example prior art GIC mirror shell.
Figure 7:
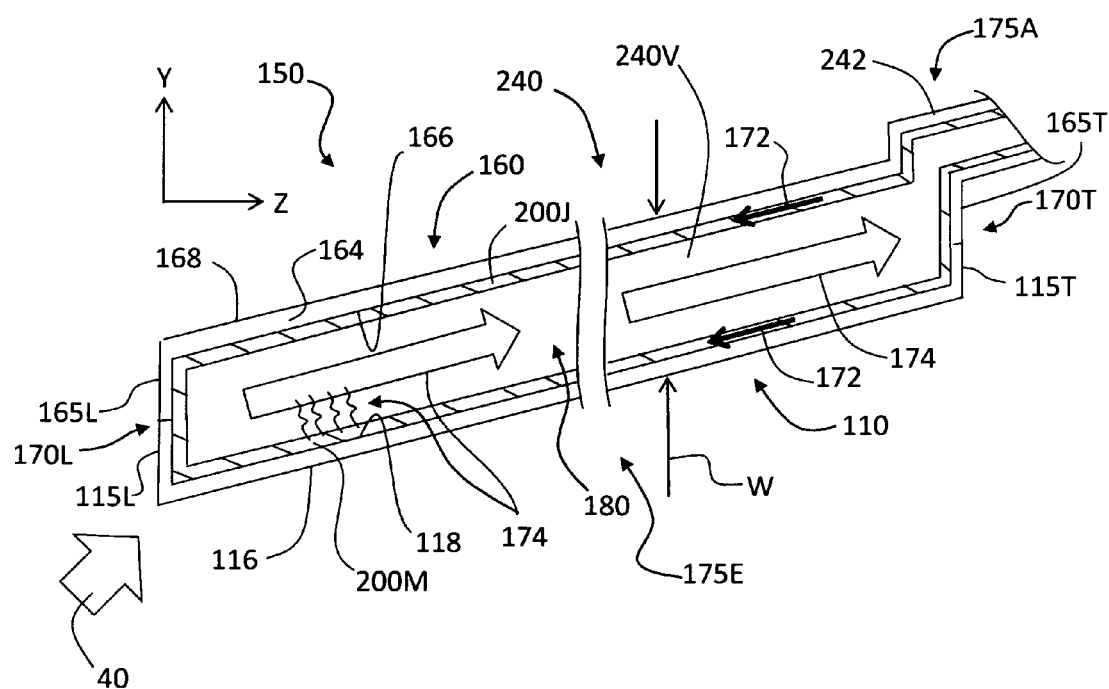
FIG. 7 is a close-up Y-Z cross-sectional view of a portion of the GIC mirror cooling assembly and the transport conduit defined therein.

FIG. 4 is an isometric view of an example prior art GIC mirror shell 110 that has an inner surface 116, an outer surface 118 and optional end walls 115L and 115T respectively formed at input and output edges 112 and 114 (end walls not shown in FIG. 4; see e.g., FIG. 7). Cartesian coordinates are shown for reference. An example GIC mirror shell 110 is formed by electroforming and is made of Nickel or Nickel alloy. An example range of thicknesses of GIC mirror shell 110 is 1 mm to 4 mm, with 1 mm to 2 mm representing exemplary thicknesses.

Figure 5:
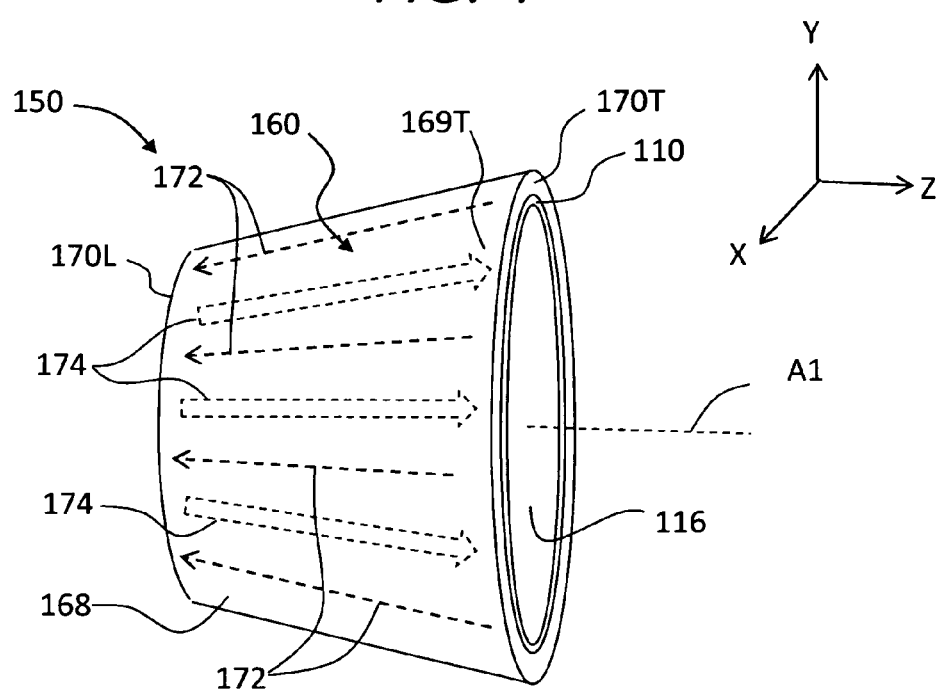
FIG. 5 is similar to FIG. 4, and illustrates an example GIC mirror cooling assembly that includes a GIC mirror shell with its outer surface surrounded by an outer jacket.
Figure 6A:
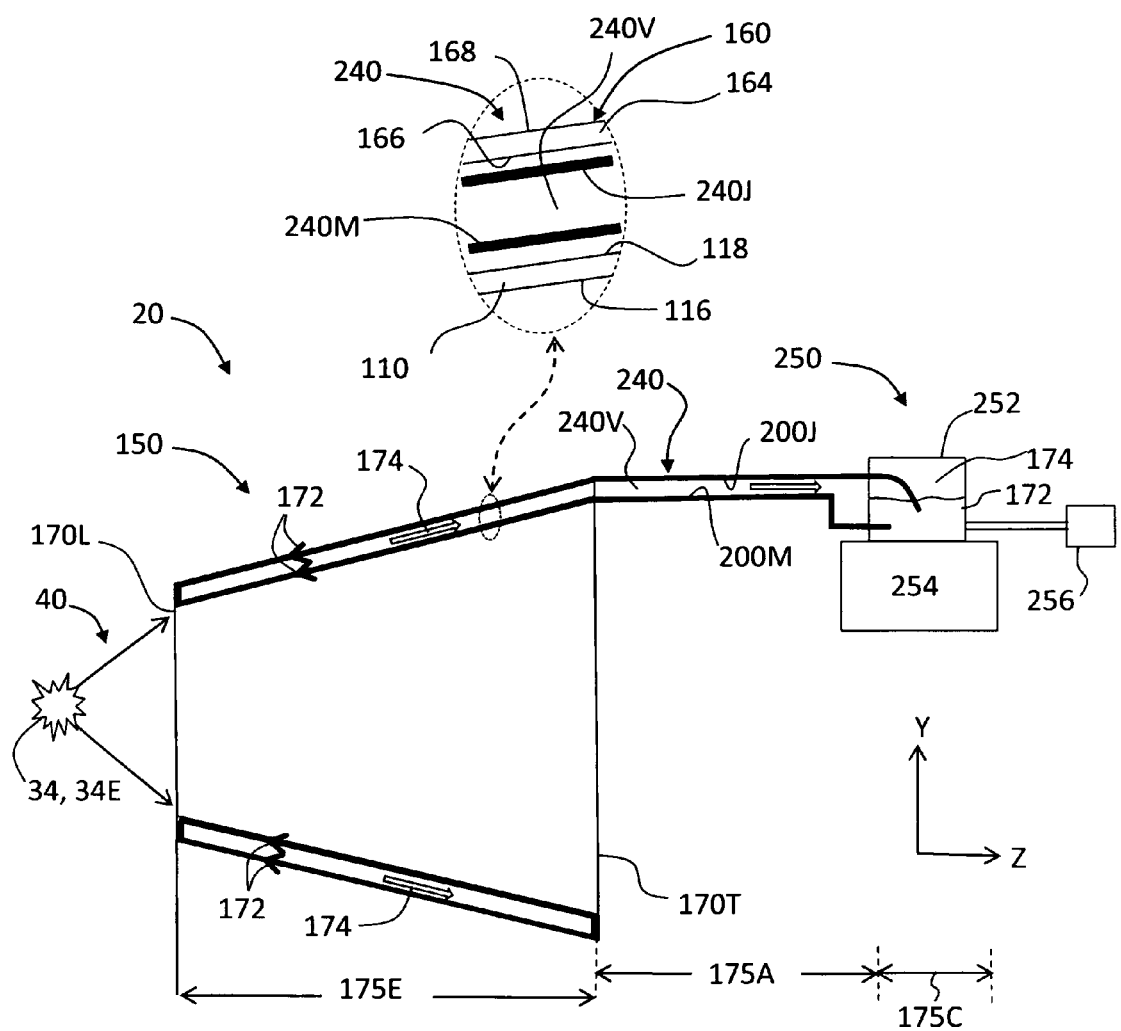
FIG. 6A is a Y-Z cross-sectional view of an example GIC mirror system that includes a GIC mirror cooling assembly.

FIG. 5 is similar to FIG. 4 but illustrates an example GIC mirror cooling assembly 150 that includes GIC mirror shell 110 interfaced with a jacket 160. Jacket 160 is arranged to be spaced apart from and cover GIC mirror shell outer surface 118. FIG. 6A is a Y-Z cross-sectional view of the GIC mirror cooling assembly 150 of FIG. 5 as part of a GIC mirror system 20. Jacket 160 includes an inner surface 166 and an outer surface 168 (see FIG. 6A, exploded inset) and respective leading and trailing ends 165L and 165T. Example materials for jacket 160 include any machinable metal, with stainless steel, Nickel and Nickel alloy being exemplary choices. An example thickness for outer wall 164 is in the range from 1 mm to 3 mm.

Jacket 160 and GIC mirror shell outer surface 118 define a chamber 180. In an example, the width W from GIC mirror shell inner surface 116 to jacket outer surface 168 (see FIG. 7) is in the range from 3 mm to 10 mm, with 5 mm to 8 mm being an exemplary range.

A wicking layer 200M is disposed in thermal contact with the GIC mirror shell outer surface 118 and end walls 115L and 115T. Also optionally included is a wicking layer 200J disposed in thermal contact with inner surface 166 of jacket 160. The combined jacket and mirror shell leading ends 115L and 165L define a leading end 170L of GIC mirror cooling assembly 150, and the combined jacket and mirror shell trailing ends 115T and 165T define a trailing end 170T of the GIC mirror cooling assembly. Leading end 170L is the end closest to EUV radiation source 34 and trailing end 170T is the end farthest from the EUV radiation source when the GIC mirror cooling assembly 150 is incorporated into SOCOMO 10.

In an example, wicking layers 200M and 200J are conformal to and in thermal contact with GIC mirror shell outer surface 118 and jacket inner surface 166. Also in an example, wicking layers 200M and 200J are disposed immediately adjacent GIC mirror shell outer surface 118 and jacket inner surface 166, respectively, i.e., without any intervening layers therebetween. In an example, wicking layers 200M and 200J have a thickness greater than 100 micron, and further in example have a thickness of between 100 micron and 2000 microns. Example materials for wicking layers 200M and 200J include foam structures made from a variety of materials such as vitreous carbon or copper or aluminum or even plastics; exemplary choices for this application would include nickel mesh, nickel powder and nickel foam. In an example, wicking layers 200M and 200J can extend to cover and provide evaporative cooling for respective GIC mirror shell end walls 115 and jacket end walls 165.

In an example, at least one of wicking layers 200M and 200J comprises a wicking material selected from the group of wicking materials comprising: metal foam, vitreous foam, reticulated plastic, reticulated polymer, woven plastic and woven polymer.

Also shown in FIG. 5 are the flow direction of vapor 174 produced by evaporation of the cooling fluid 172, and the flow direction of the cooling fluid, as described in greater detail below. Jacket 160, GIC mirror shell 110 and their respective wicking layers 200J and 200M define transport conduit 240, which includes a vapor channel 240V that supports the flow of coolant vapor 174. In an example, cooling fluid 172 includes at least one of water, methanol, ethanol and ammonia.

FIG. 6A shows EUV radiation source 34 along with the GIC mirror cooling assembly 150, wherein GIC mirror system 20 also includes a condenser system 250 that includes a reservoir 252 fluidly connected to transport conduit 240. Reservoir 252 is also in thermal contact with a heat exchanger 254. In an example, a filter unit 256 fluidly connected to reservoir 252 is optionally employed to filter cooling fluid 172. Filter unit 256 is operable to remove small particulates (>5 microns) from cooling fluid 172 so that particulates cannot deposit in and clog wicking layers 200M and 200J—at least to the point where capillary flow of the cooling fluid is substantially affected.

Figure 6B:
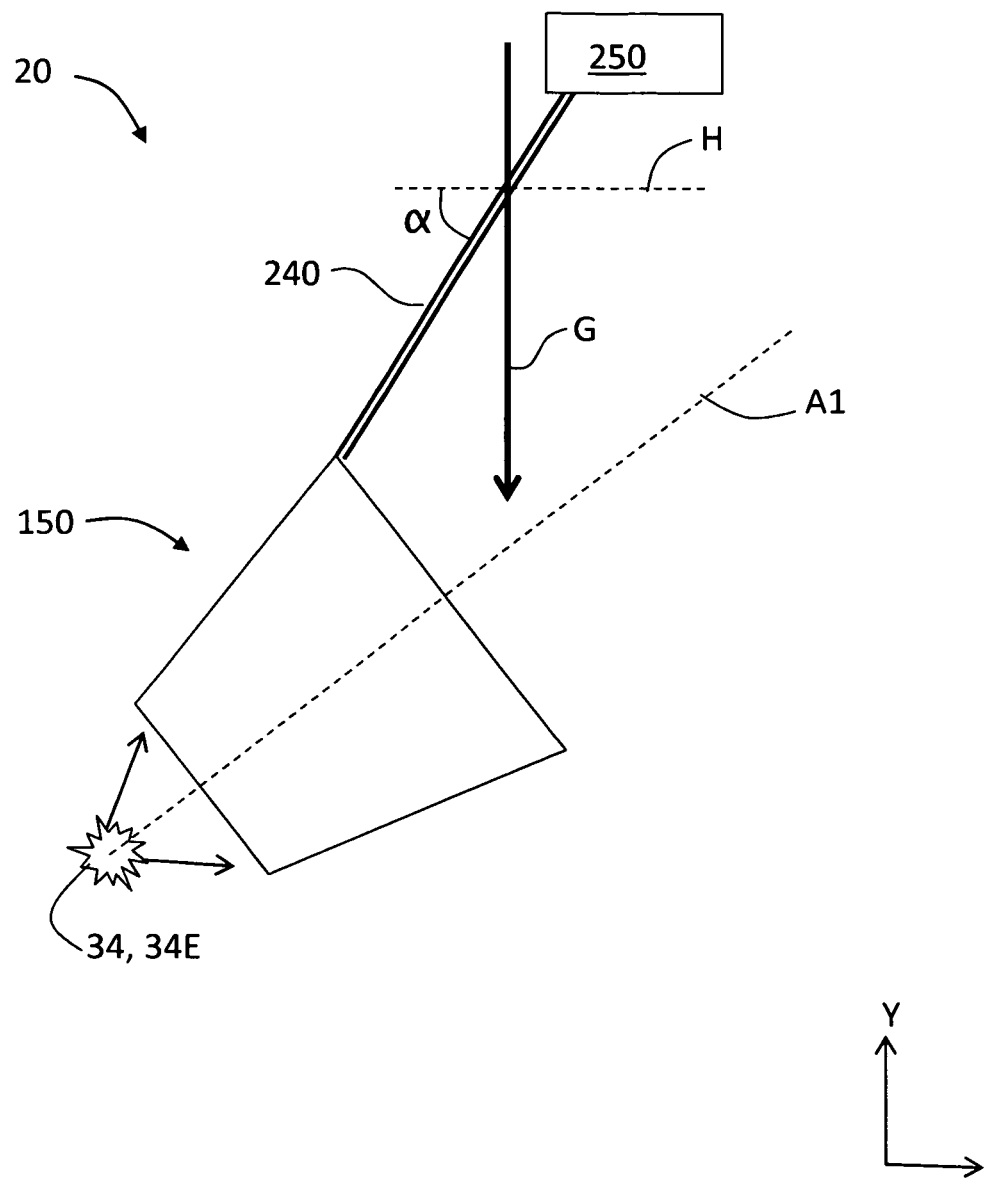
FIG. 6B is similar to FIG. 6A and illustrates an example embodiment where the GIC mirror system is arranged relative to the direction of gravity so that the capillary flow is assisted by gravity.

FIG. 6B is similar to FIG. 6A and illustrates an example embodiment where the GIC mirror system is arranged relative to the direction of gravity as indicated by arrow G so that the capillary flow from condenser system 250 to GIC mirror cooling assembly 150 (via transport conduit 240) is assisted by gravity. Dashed line H represents the "horizon" and is perpendicular to the direction of gravity G. Angle α is the local angle between the horizontal and the direction of wicking flow along the transport conduit 240; or along the evaporative segment 150 relative to horizon H.

With reference again to FIG. 6A, reservoir 252 includes a portion that contains condensed liquid 172 in contact with its corresponding vapor 174. Heat exchanger 254 operates to remove heat from liquid 172, which acts to condense the vapor 174 to form more liquid. Reservoir 252 is fluidly connected to wicking layers 200M and 200J so that the condensed fluid 172 in the condenser unit can flow to the respective wicking layers and serve as a cooling fluid as described below.

GIC mirror system 20 includes three main regions: an evaporation region 175E defined mainly by GIC mirror cooling assembly 150, a condensation region 175C defined by condenser system 250, and an adiabatic region 175A defined by a connector conduit 242 that connects the GIC mirror cooling assembly to the condenser unit. This configuration generally defines a heat pipe FIG. 7 is a close-up Y-Z cross-sectional view of a portion of the GIC mirror cooling assembly 150 and transport conduit 240. Shown in FIG. 7 are wicking layers 200M and 200J in contact with mirror shell outer surface 118 and jacket inner surface 116 respectively. In an example, these wicking layers 200M and 200J are also configured to be in thermal contact with at least one of leading and trailing ends 170L and 170T. Also shown in FIG. 7 is the flow of vapor 174 from leading end 170L toward trailing end 170T. Squiggly lines 174 schematically illustrate the vaporization process in wicking layers 200M and 200J that gives rise to cooling-fluid vapor 174.

Figure 8:
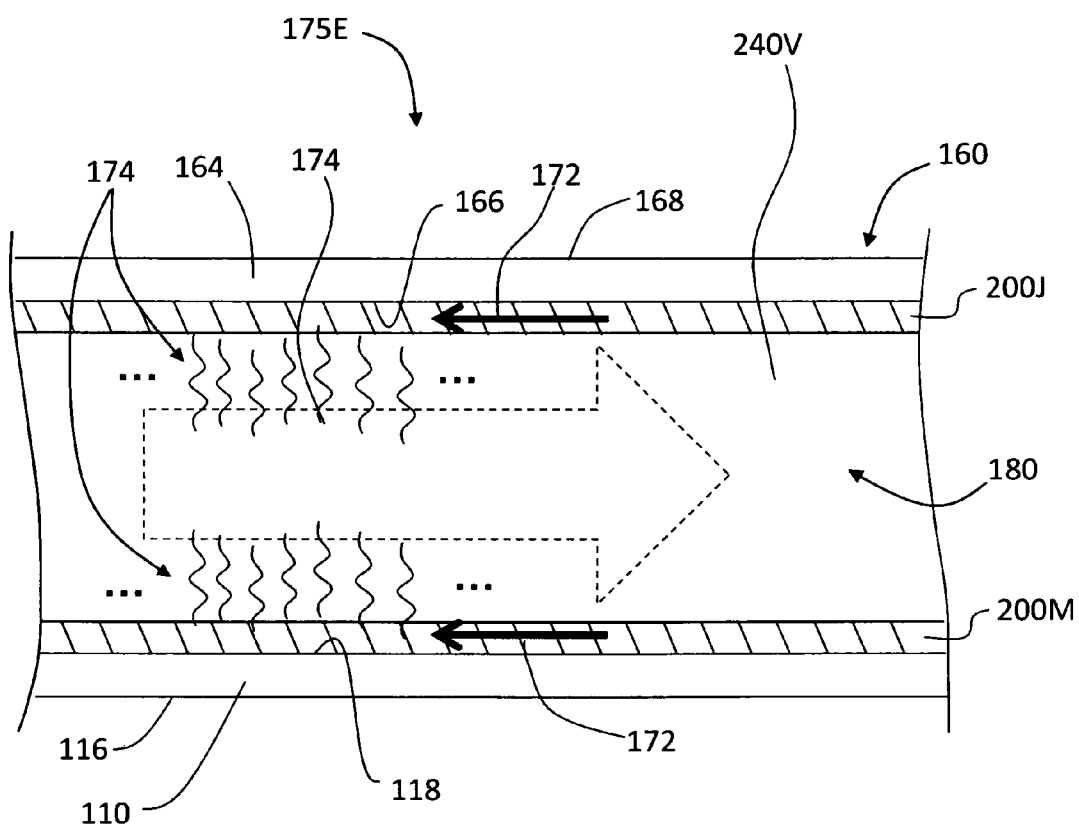
FIG. 8 is a close-up cross-sectional view of the feed line connecting the GIC mirror cooling assembly and the condenser region.

Connection conduit 242 serves to fluidly connect transport conduit 240 to condenser system 250 and in an example defines an adiabatic region 175A for GIC mirror system 20. FIG. 8 is a close-up Y-Z cross-section of a portion of the evaporation region 175E showing the wicking layers 200J and 200M in thermal contact with jacket 160 and GIC mirror shell 110, respectively.

Figure 9:
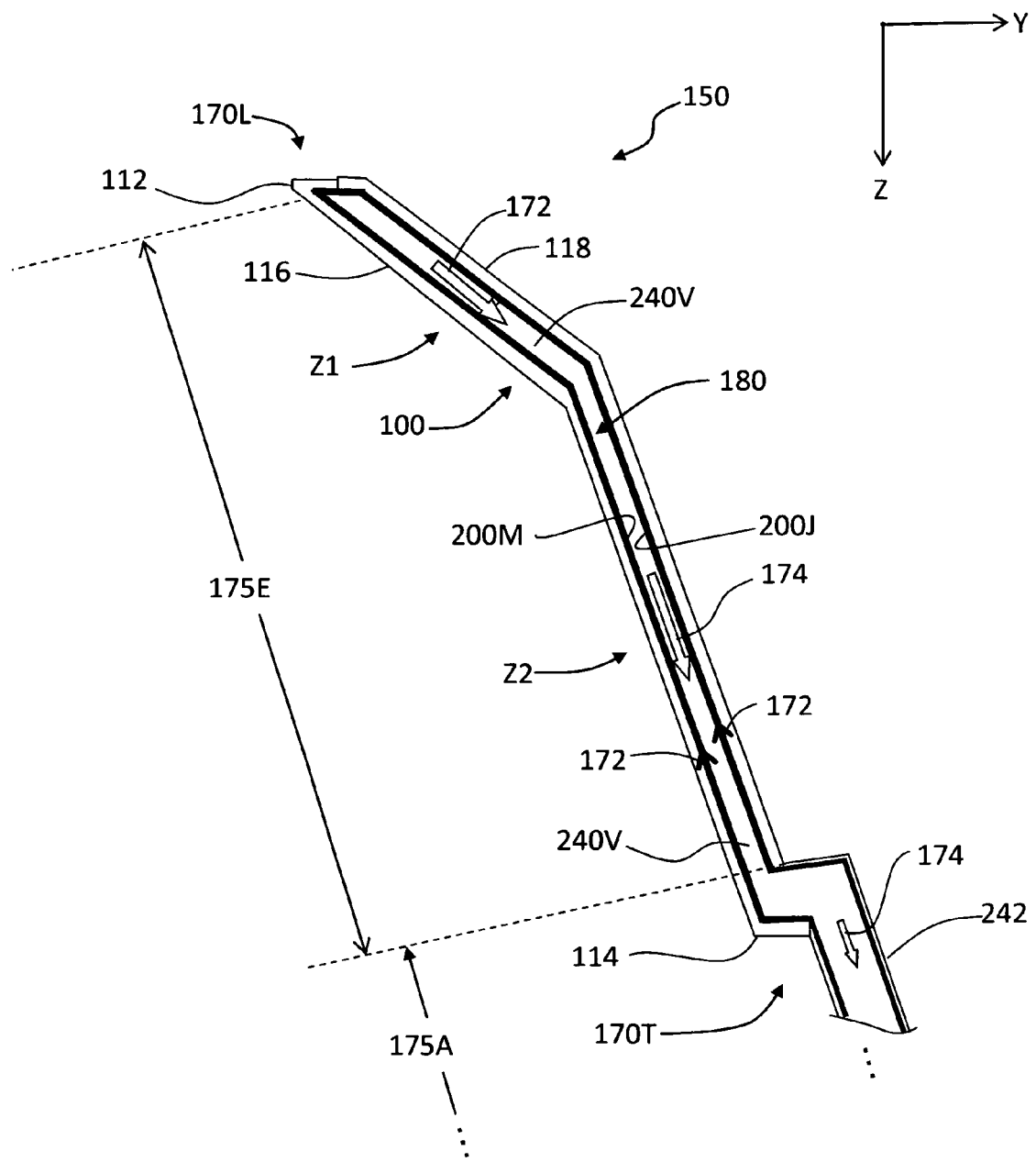
FIG. 9 is a Y-Z cross-sectional view of an example GIC mirror cooling assembly that includes a GIC mirror shell having two different mirror zones.
Figure 10:
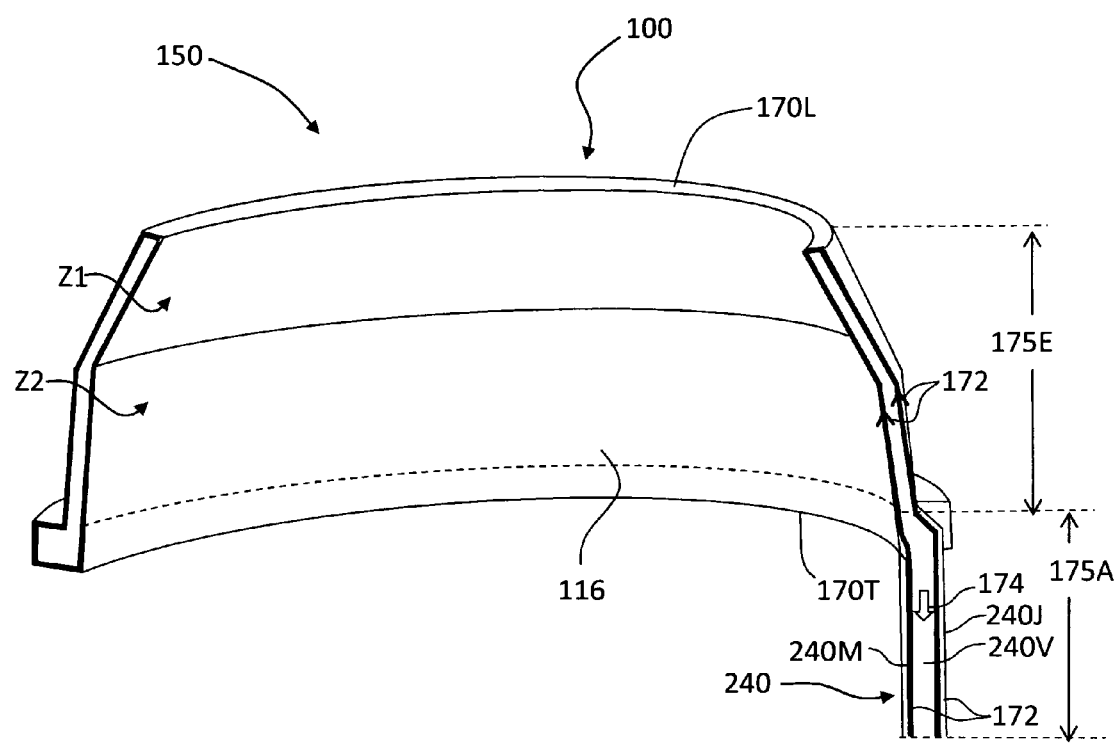
FIG. 10 is a cut-away view of a section of the GIC mirror cooling assembly for the two-zone GIC mirror shell of FIG. 9.

FIG. 9 is a Y-Z cross-sectional view of an example GIC mirror cooling assembly 150 that includes a GIC mirror shell 110 having two different mirror zones Z1 and Z2. FIG. 10 is a cut-away view of a section of GIC mirror cooling assembly 150 for the two-zone GIC mirror shell of FIG. 9. Note that the wicking layers 200M and 200J extend and are continuous throughout evaporation region 175E and adiabatic region 175A regions. Wicking layers 200M and 200J (which in an example are actually different sections of a single continuous wicking layer) extend and cover the interior portions of chamber 180 at leading and trailing ends 170L and 170T. Further in an example, wicking layers 200M and 200J extend through adiabatic region 175A and all the way to the coolant reservoir 252 in the condenser system 250 (i.e., condenser region 175C; see FIG. 6).

In a commercial EUV lithography system, the total collector shell system (multiple shells) is expected to be subjected to 40 kW to 60 KW, which represents a large thermal load for this type of application. The thermal management of each GIC mirror shell 110 must be implemented within the constraints of the optical design of the particular GIC mirror system.

In particular, in GIC mirror systems 20 having multiple GIC mirror shells 110, the GIC mirror shells are arranged in a nested and concentric (or substantially concentric) configuration (see e.g., FIG. 2 and FIG. 3), and the cooling system components must fit within non-obscuring or "dark regions" between the GIC mirror shells so that the optical pathways from the EUV radiation source 34 to the intermediate focus IF remain substantially unobstructed or not obscured. The relatively narrow width of GIC mirror cooling assembly 150 is amenable for forming a nested GIC mirror system 20 without substantially obscuring the optical pathways for the EUV "working" radiation.

Figure 11A:
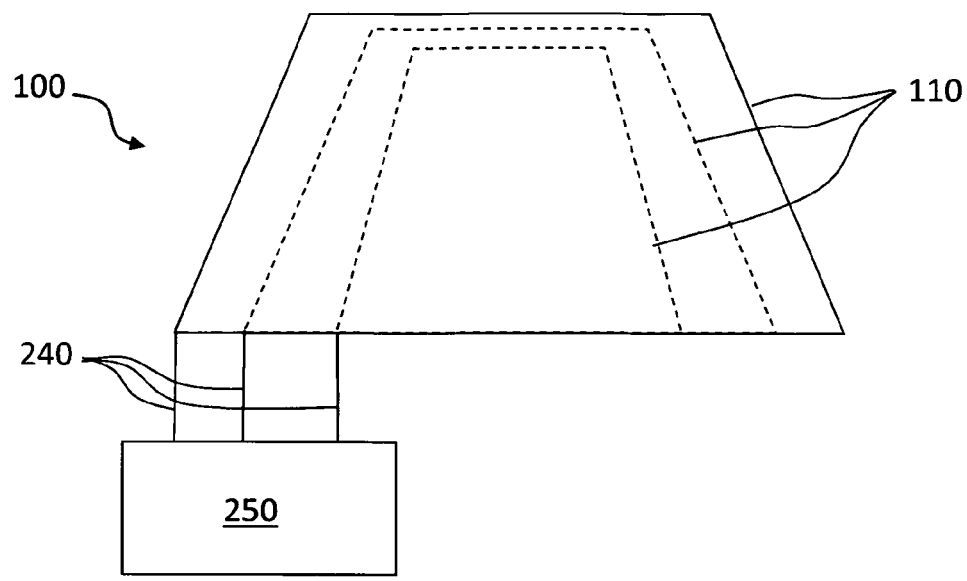
FIG. 11A is a schematic diagram of an example GIC mirror system that includes multiple GIC mirror assemblies each fluidly connected to the condenser system via respective conduits.
Figure 11B:
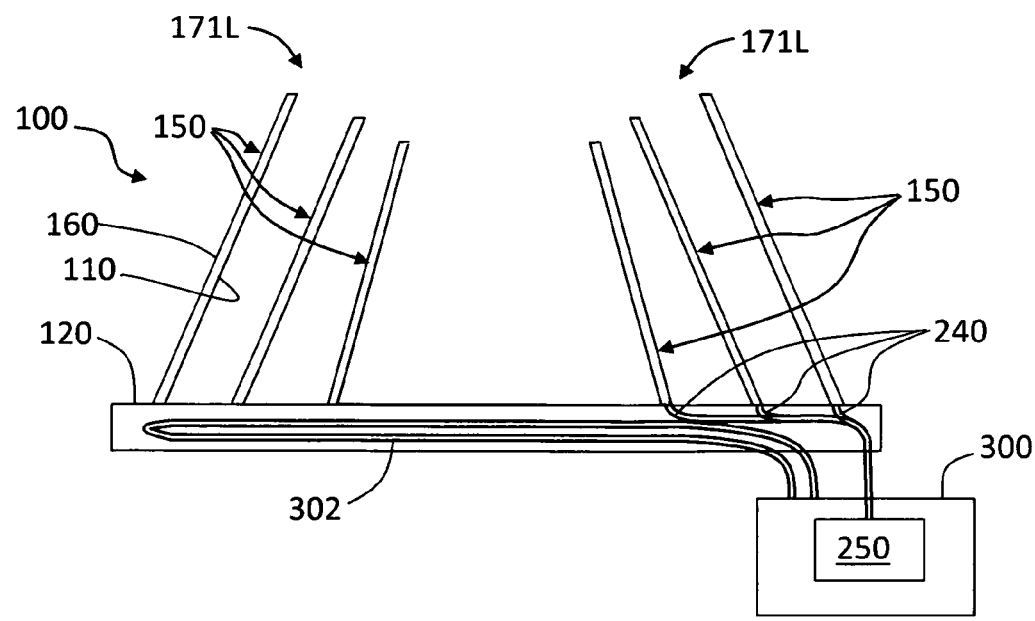
FIG. 11B is a cross-sectional diagram of an example GIC mirror system that includes multiple GIC mirror assemblies supported by a cooled spider, wherein the cooled spider serves as a physical structure to facilitate fluid flow from the condenser system to the GIC mirror assemblies.

In other examples such as illustrated in FIG. 11A and FIG. 11B, a GIC mirror system 100 comprises multiple GIC mirror shells 110 and thus multiple GIC cooling assemblies 150 are used, with the GIC cooling assemblies connected to a common condenser system 250 or to separate condenser systems via transport conduits 240.

For example, with reference to FIG. 11B, spider 120 is configured to physically support the conduits 240 carrying the flow of fluid 172 to wicking layers 200M and 200J and to support the outflow of vapor 174. The example GIC mirror system 20 shown includes multiple GIC mirror assemblies supported by a spider 120, and wherein the spider serves as a physical structure to facilitate the flow of cooling fluid 172 from the condenser system 250 to the GIC mirror cooling assemblies 150.

It is noted that the cooling of spider 120 is generally accomplished via conventional cooling because the power loading on the spider is anticipated to be significantly less than the power loading on the GIC mirror cooling assembly 150. In this regard, the cooled spider 120 is not part of the evaporative cooling circuit. However, spider 120 may serve as a support structure to facilitate the flow of cooling fluid 172 between the GIC mirror assemblies 150 and condenser system 250.

General Method of Operation

In the general method of operation of thermally managed GIC mirror system 20, EUV radiation source 34 generates EUV radiation 40 (along with out-of-band radiation, not shown), which is incident upon reflective inner surface 116 of GIC mirror shell 110. GIC mirror shell 110 receives, collects and focuses this radiation 40 at intermediate focus IF (see FIG. 1). Some of this radiation incident on the shell surface(s) 116 is absorbed and serves to heat GIC mirror shell 110.

As EUV radiation 40 (along with out-of-band radiation, not shown) heats leading end 170L, the rate of evaporation of liquid 172 in wicking layers 200M and 200J in evaporation region 175E increases. The resulting vapor 174 collects in chamber 180 closest to leading end 170L, causing a pressure differential relative to the trailing end 170T of the chamber 180. This pressure differential causes the flow of vapor 174 from evaporation region 175E through adiabatic region 175A and to condenser region 175C.

The vapor 174 reaches condenser system 250 and is condensed by the action of heat exchanger 254 to form fluid 172 in reservoir 252. Meanwhile, the cooling fluid 172 that evaporates from wicking layers 200M and 200J in evaporation region 175E is replaced by capillary action. Cooling fluid 172 is continuously fed to wicking layers 200M and 200J by reservoir 252, thereby supporting the continuous capillary flow of cooling fluid in the wicking layers in the evaporation region 175E. This in turn serves to maintain the continuous and self-sustaining evaporation and condensing cycle of the heat pipe.

Wicking layers 200M and 200J cause the heat from GIC mirror shell 110 to be absorbed by cooling fluid 172 whereby the heat ultimately converts the cooling fluid to vapor 174. The flow of vapor 174 out of chamber 180 at or near trailing end 170T via vapor conduit 240V serves to remove the vapor from GIC mirror shell assembly 150. The heat stored in vapor 174 is then released when the vapor is condensed to liquid by condenser system 250. Heat exchanger 254 serves to remove the released heat that collects in reservoir 252. Thus, the heat from GIC mirror shell 110 is locally stored in vapor 174, and this stored heat is transported via the vapor to a location remote from the GIC mirror shell where the heat can safely be released and carried away from the system 20.

As discussed above, the flow of cooling fluid 172 to feed wicking layers 200M and 200J provides for substantially uniform heat removal via evaporation in the evaporation section 175E. Likewise, the flow of vapor 174 out of chamber 180 provides for substantially uniform vapor removal (and thus heat removal) from the chamber.

Startup of the evaporative thermal management process as described above may occur due to heating from radiation 40 onto the GIC mirror assembly 100 from the EUV radiation source 34 or it may be 'pre-started' via an exogenous heat source 34E (see FIG. 6), such as a heat lamp, to begin the heating process before the EUV radiation source 34 is turned on.

GIC mirror system 20 preferably operates at a steady state that does not encroach too closely on any of the well-known limits of operation of heat pipes, such as the sonic limit, the capillary pressure limit, the entrainment limit and the boiling limit. The sonic limit is reached when the flow of vapor 174 velocity at the exit of the evaporation region 175E approaches the sound velocity. At the sound velocity, the vapor flow will be limited and therefore the cooling rate will be limited. Simulations indicate that the coolant vapor 174 (e.g., water as coolant) and vapor temperature and density can be controlled to provide cooling rates sufficient for this particular EUV GIC mirror assembly application.

The capillary pressure limit is reached when the flow of cooling fluid 172 to the warmest regions of chamber 180 is insufficient to maintain the wetting of wicking layers 200M and 200J. This can lead to one or both of wicking layers 200M and 200J drying out. Simulations indicate (see quantitative example below) that the cooling fluid viscosity, wick permeability and wick geometry can be controlled to provide cooling rates sufficient for this EUV GIC mirror assembly application.

In addition, capillary flow can be aided by providing a gravitational assist by locating reservoir 252 of the condenser region 175C at an elevation above the evaporation region 175E and adiabatic region 175A, as illustrated by way of example in FIG. 6B. This can also be achieved by locating the adiabatic region 175A above the evaporation region 175E and tilting the adiabatic region to gravitationally assist the flow of cooling fluid 172. In particular, this example configuration allows cooling fluid 172 to flow "downhill" (i.e., with the assistance of gravity G) from reservoir 252 through the transport conduit 240 and into the evaporation region 175E. In an example, the capillary flow of cooling fluid 172 from reservoir 252 to chamber 180 has a flow component in the direction of gravity G. This can include orienting transport conduit 240 so that the flow of cooling fluid 172 has a component that is gravity assisted. An example gravity-assist configuration is further discussed in connection with the quantitative example set forth below.

In the standard operation of a heat pipe system, there is simultaneous counter-flow of liquid and vapor, namely that of the cooling fluid 172 and attendant cooling-liquid vapor 174. Viscous shear forces occur at the interface of the counter-streaming cooling fluid 172 and vapor 174. Care must be taken to ensure that the viscous shear forces do not exceed the capillary surface tension forces driving cooling fluid 172 through wicking layers 200M and 200J. The entrainment limit is when the viscous shear forces equal the capillary surface tension forces. Simulations indicate that through appropriate choice of cooling fluid (e.g. water), wick architecture and vapor channel size, the cooling rates can be achieved well below the entrainment limit and meet the requirements for this EUV GIC mirror assembly application. This is discussed in the example set forth below.

If the local temperature in the wicking layers 200M and 200J were allowed to get too high and the local pressure too low, it could lead to the formation of macroscopic vapor bubbles and reach the boiling limit (also called the bubble formation or effervescence limit). This would inhibit the flow of cooling fluid 172 through the wicking layers 200M and 200J and the wicking layers could dry out. Simulations indicate that the cooling fluid (e.g., water) viscosity, wicking layer permeability and wick geometry can be controlled to avoid the boiling limit and provide cooling rates sufficient for this EUV GIC mirror assembly application.

Jacket to Mirror-Shell Connection

In an example embodiment, jacket 160 is formed as a separate part from GIC mirror shell 110 and so needs to be interfaced with GIC mirror shell 110. The resulting chamber 180 needs to be sealed and be vacuum-compatible, and conform to restrictive EUV lithography non-contamination requirements.

Figure 12A:
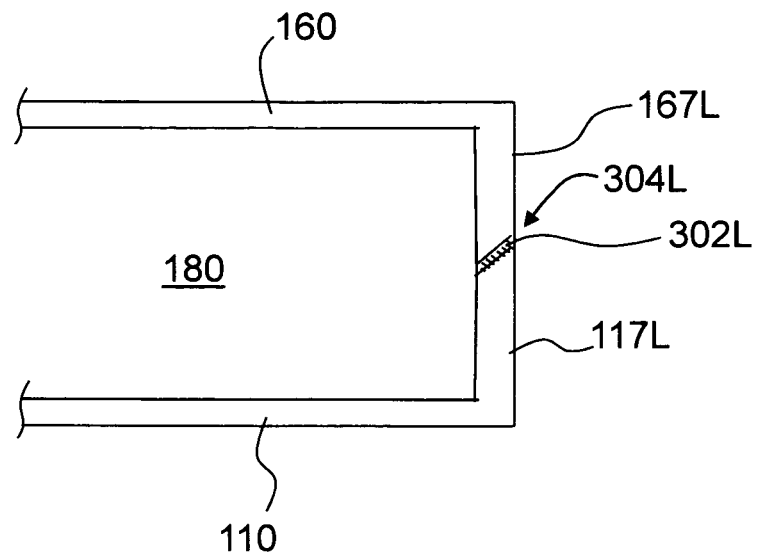
FIGS. 12A and 12B are close-up, schematic diagrams of an end of the GIC mirror cooling assembly showing example interfacing of the mirror shell to the jacket using a welded or brazed joint.

One method for interfacing jacket 160 and GIC mirror shell 110 is via welding or even laser brazing, e.g., to form a welded or brazed joint. With reference to the close-up end view of FIG. 12A, in one example, GIC mirror shell flanges 117L and the corresponding jacket flanges 167L are precision microwelded or laser brazed together to form welded or brazed joints 302L between GIC mirror shell 110 and jacket 160.

Figure 12B:
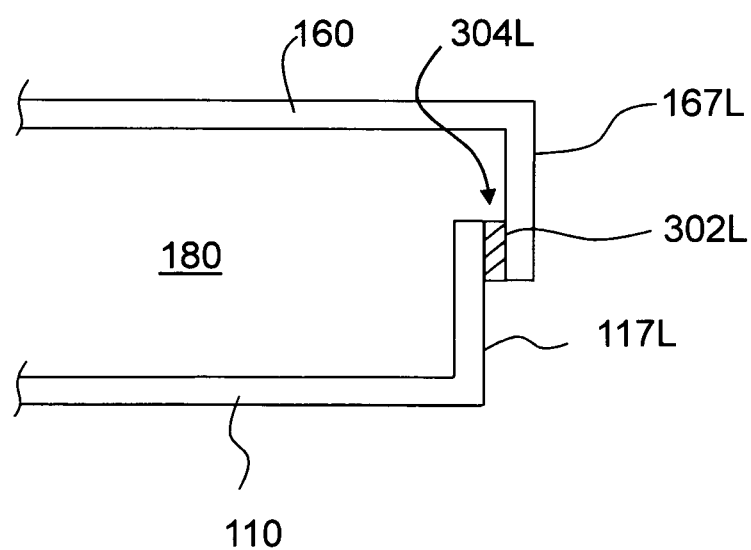

In one example, the flanges 117L and 167L are welded at their edges while in another example the flanges are overlapped and welded (FIG. 12B) so that interface 304L has a greater surface area than an edge-to-edge interface. This approach keeps the localized heating associated with the welding or brazing process from affecting (e.g. distorting) the active surface of the reflecting shell.

Figure 13:
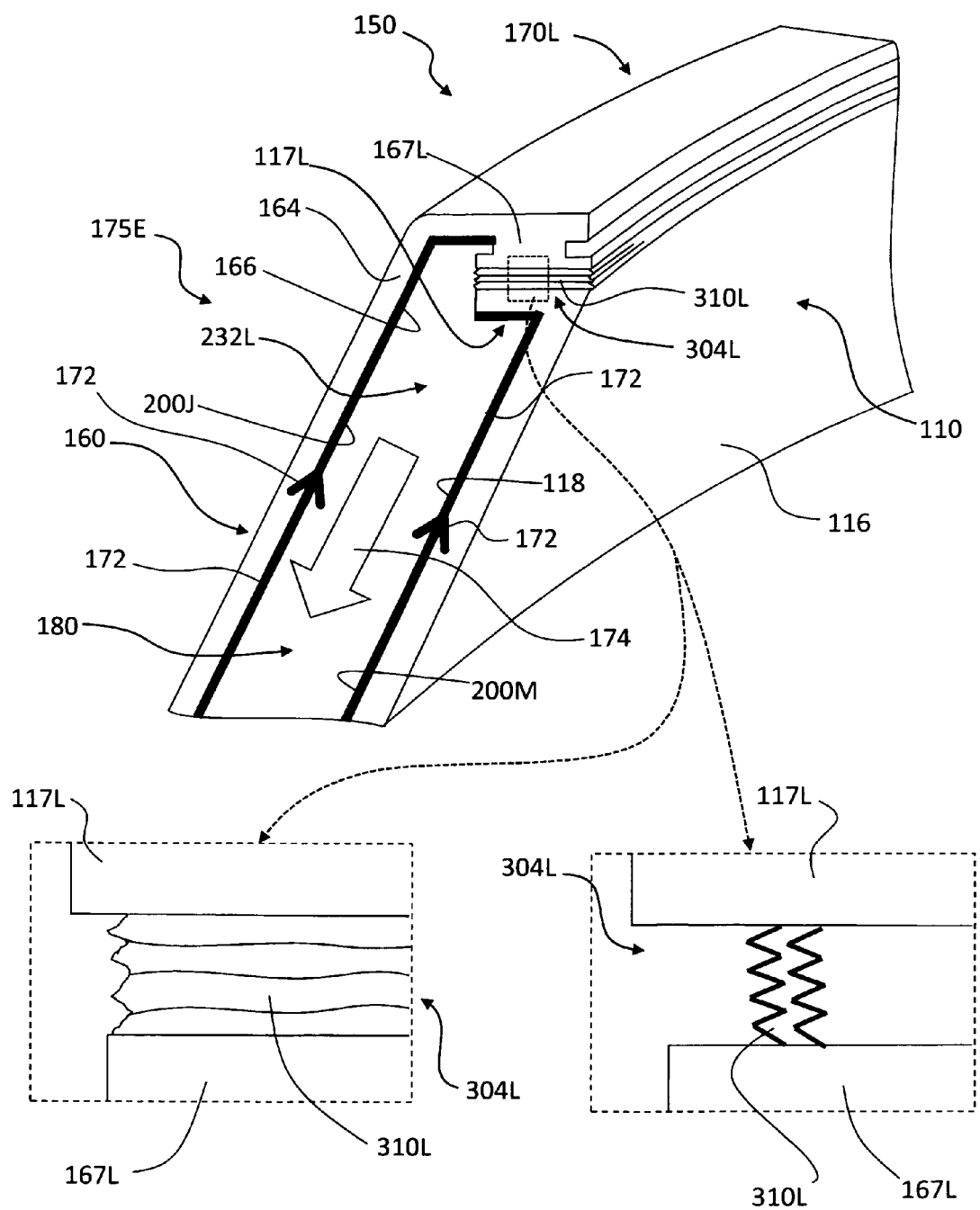
FIGS. 13 through 15 are various cross-sectional views of example GIC cooling assemblies that illustrate different embodiments for interfacing the GIC mirror shell to the jacket.
Figure 14:
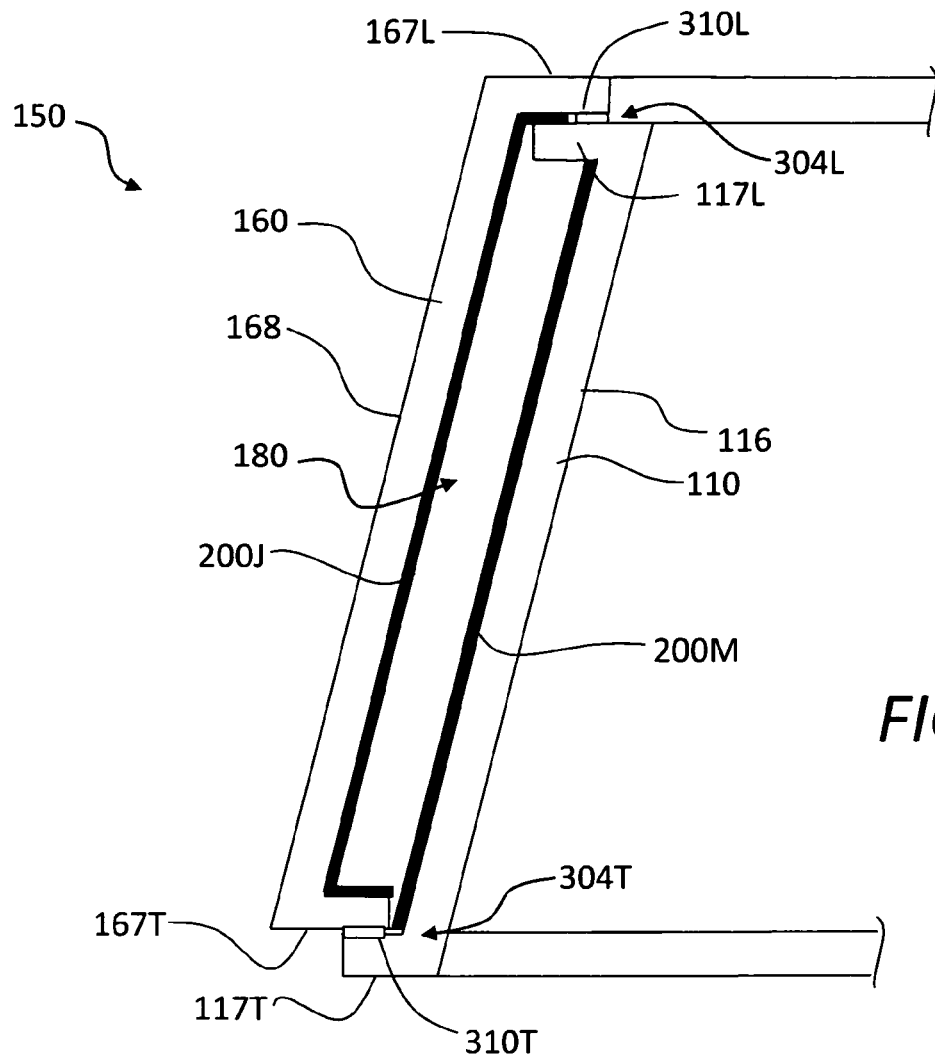
Figure 15:
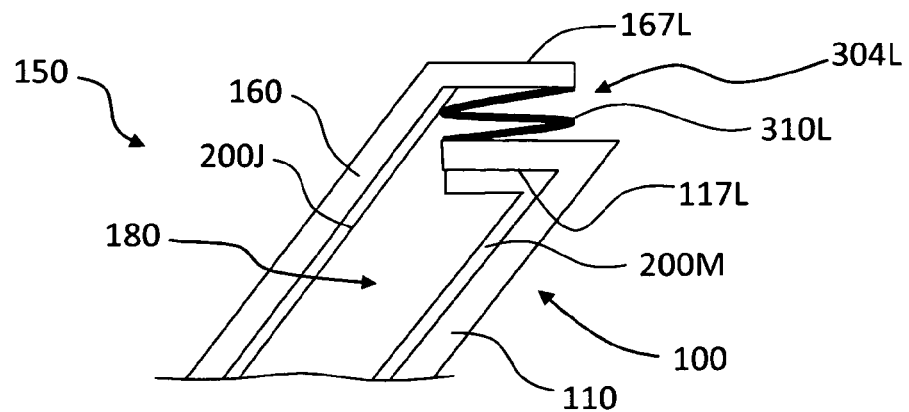

A consideration in forming GIC mirror cooling assembly 150 is that stress can be introduced into the assembly that can deform GIC mirror shell 110, thereby compromising the optical figure of reflective inner surface 116. Thus, with reference to the close-up view of GIC cooling assemblies of FIG. 13 through FIG. 15, in an example embodiment, GIC mirror cooling assembly 150 includes at least one compliant interface such as compliant interface 304L. In one example, compliant interface 304L includes a compliant member 310L. In FIG. 13, compliant member 310L is shown disposed between overlapping GIC mirror shell flange 117L and jacket flange 167L. In an example, compliant member 310L comprises a hinge, a flexure, a bellows, a gasket, or like member. In another example, compliant member 310L includes an epoxy with low out-gassing properties. Compliant member 310L is operable to absorb residual strain caused by interfacing GIC mirror shell 110 and jacket 160 to prevent the residual strain from propagating to GIC mirror shell reflective inner surface 116. In another example, compliant interface 304L includes a welded or laser brazed joint.

GIC Mirror Cooling Assembly with Heat Shield

Figure 16:
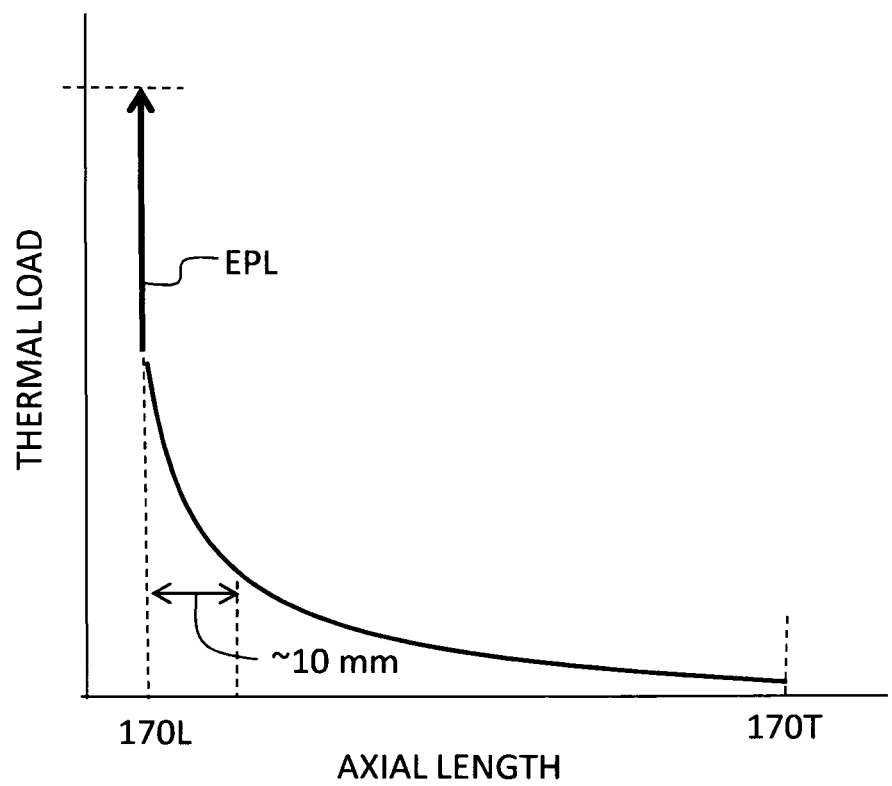
FIG. 16 is a schematic plot of a typical thermal load versus axial distance along the GIC mirror cooling assembly when the GIC mirror cooling assembly is incorporated into a SOCOMO and exposed to radiation from the source.

FIG. 16 is a schematic plot of an example thermal load (arbitrary units) on the optical surface of a GIC mirror shell 110 as a function of axial position Z along GIC mirror cooling assembly 150 from the leading to trailing ends 170L to 170T when the GIC mirror cooling assembly is arranged in a SOCOMO 10 and is subjected to EUV radiation 40 (along with out-of-band radiation, not shown) as described above. Much of the thermal load occurs at leading end 170L, and decreases with distance from the leading end. The thermal load illustrated in FIG. 12 is capable of being thermally managed by the evaporative thermal management systems and methods disclosed herein.

The plot of FIG. 16 includes an arrow EPL (elevated power loading) that schematically denotes a greatly elevated and localized power loading from the source on the very leading edge of front end 170L of GIC mirror cooling assembly 150, for example, in the case where there is no heat shield protecting the shell flange 117L at the front end (note that the flange serves no optical function).

Figure 17A:
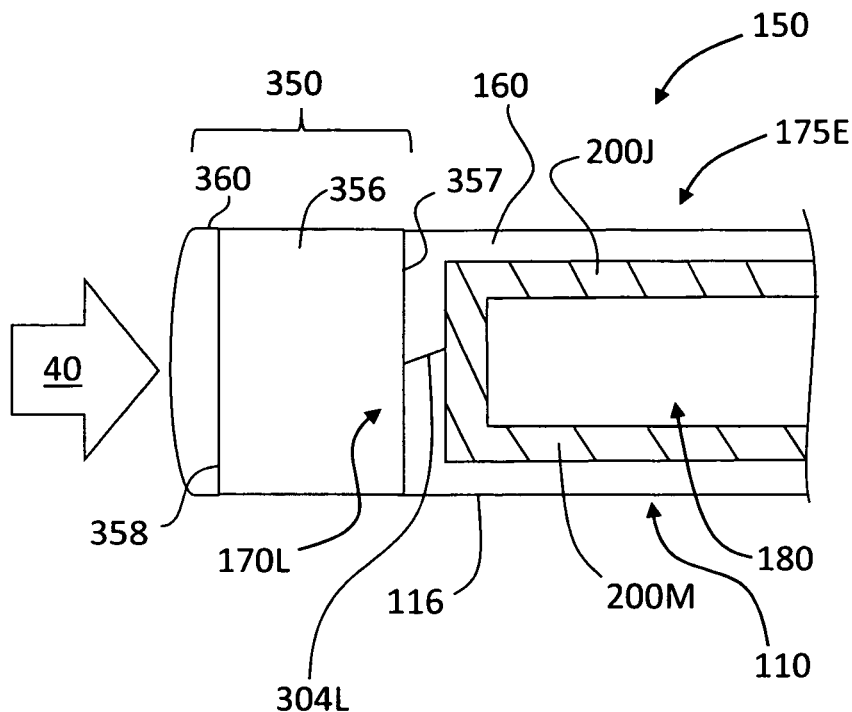
FIGS. 17A and 17B are close-up input-end cross-sectional views of example GIC mirror cooling assemblies that includes an example thermal shield.
Figure 17B:
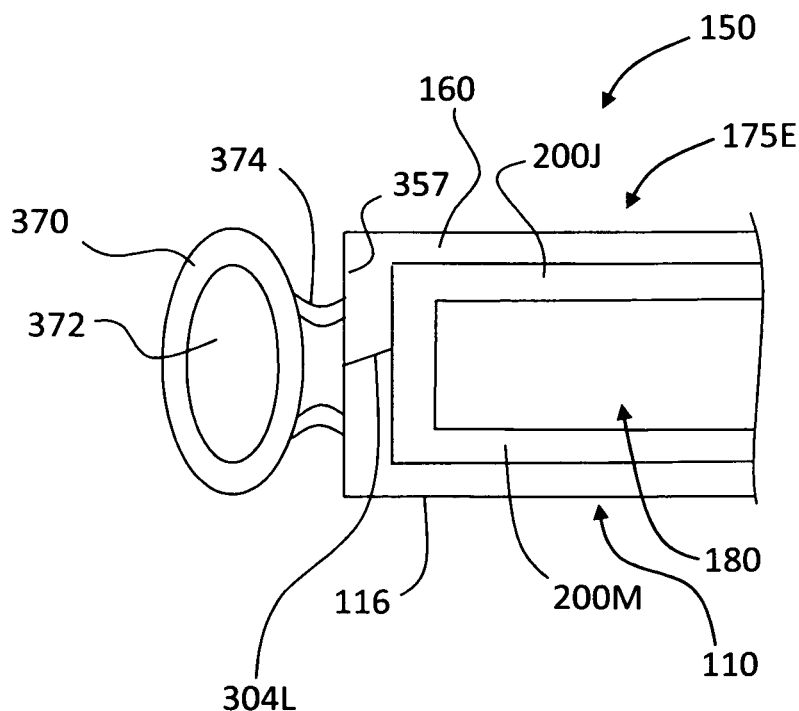

Rather than trying to manage this intense leading edge thermal load using only the evaporative thermal management systems and methods described herein, in an example embodiment, an additional heat shield is employed. FIG. 17A and FIG. 17B are close-up leading-end views of GIC cooling assembly 150 wherein the assembly includes an annular heat shield 350 configured to reduce the amount of this leading-edge heating at the non-optical leading surface (i.e., flange). The heat shield 350 can opportunistically be located to also protect even small leading sections of the optical surface that would otherwise be thermally overloaded by the intense EUV source 34.

In FIG. 17A, thermal shield 350 includes an insulating member 356 with an inner surface 357 adjacent leading end 170L, and an opposite outer surface 358. Insulating member 356 is made of an ultra-low thermal conductivity material such as a low density ceramic (e.g., ceramic foam) or an aero-gel material.

In an example, thermal shield 350 in FIG. 17A includes a metal layer 360 on insulating member outer surface 358. Metal layer 360 comprises a metal having a high melting temperature, and an exemplary metal for metal layer 360 is tungsten. Thus, the thermal load at leading end 170L is dissipated by radiative loss from the metal layer 360 as well as some modest conduction of heat via insulating member 356.

FIG. 17B is similar to FIG. 17A and illustrates an example embodiment wherein thermal shield 350 includes a cooling ring 370 that defines a cooling channel 372 that runs in front of and around the leading edge of the GIC cooling assembly thereby protecting leading end 170L from direct power loading from EUV radiation source 34. Cooling fluid 172 is provided to cooling ring 370 via a separate water cooling system (not shown) that need not be part of the evaporative cooling system. Cooling ring 370 is thus cooled using non-evaporative (i.e., non-heat-pipe) cooling mechanisms. An exemplary material for cooling ring 370 is Nickel, and a suitable cooling fluid is water.

Cooling ring 370 is preferably stood off from the leading end 170L of the GIC cooling assembly 150. The stand-off may be accomplished using stand-off elements such as a few attachment clips 374 attached to GIC cooling assembly 150. Alternatively, another stand-off structure (not shown) may be used that makes cooling ring 370 free-standing relative to the GIC cooling assembly.

Thermal shield 350 may also serve the additional function of mitigating erosion of GIC mirror shell reflective surface 116, which in an example includes a gold separation layer covered with a ruthenium reflective layer.

Self-Healing Nature of Evaporative System

The heat pipe evaporative mechanism employed in the systems and methods disclosed herein is substantially self-healing. That is, achievement of wetting symmetry in the wicking layers will naturally be driven by the capillary forces in the wicking layer. If one region is hotter than another, it will have greater evaporation and thus the capillary action in the wicking layer will be stronger, thereby providing more cooling fluid 172 to evaporating region 175E. Similarly, any non-uniformity in the evaporation rate will build an over-pressure to move the vapor out of that region. Therefore, the architectural uniformity requirements in the evaporative cooling system are not as stringent as in a conventional water cooling configuration.

EUV Lithography System with Thermally Managed GIC SOCOMO

Figure 18:
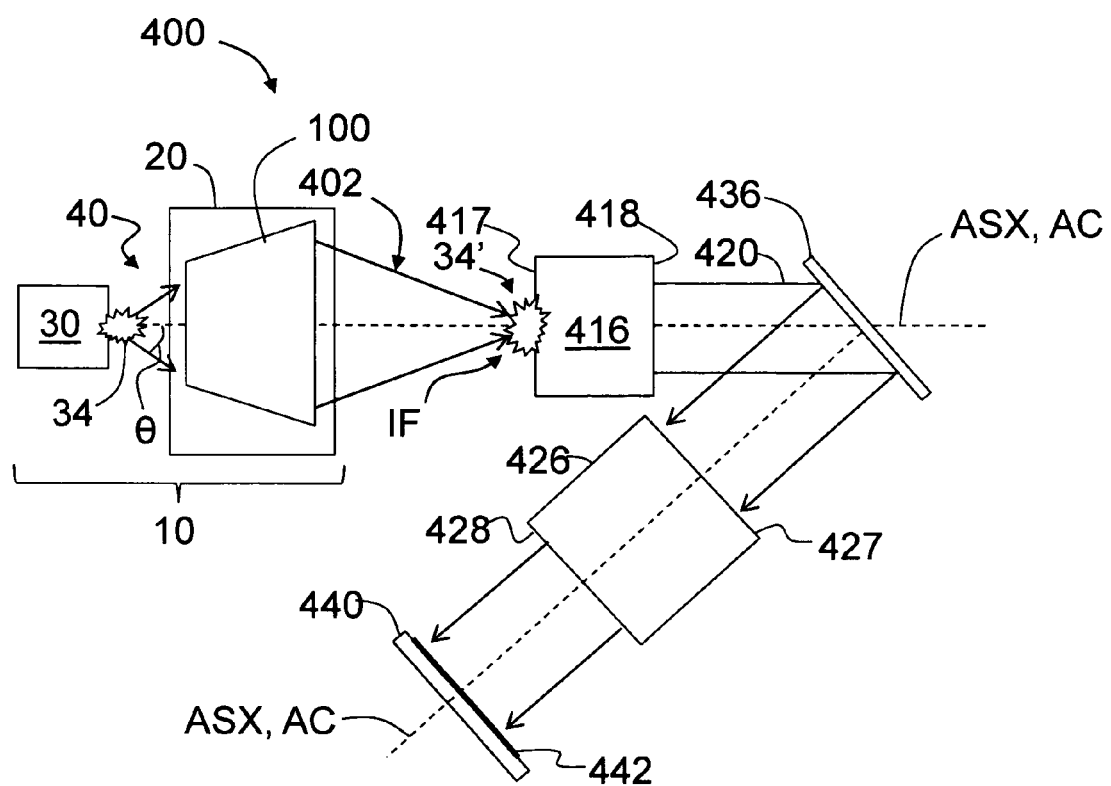
FIG. 18 is a schematic diagram of an example EUV lithography system that incorporates a GIC SOCOMO that includes the evaporative GIC mirror cooling assembly of the present disclosure.

FIG. 18 is an example EUV lithography system ("system") 400 according to the present invention. Example EUV lithography systems are disclosed, for example, in U.S. Patent Applications No. US2004/0265712A1, US2005/0016679A1 and US2005/0155624A1, which Applications are incorporated herein by reference.

System 400 includes a system axis ASX and EUV radiation source 34, such as a hot plasma source, that emits working EUV radiation 40 at λ=13.5 nm. EUV radiation 40 is generated, for example, by an electrical discharge source (e.g., a discharged produced plasma, or DPP source), or by a laser beam (laser-produced plasma, or LPP source) on a target of Xenon or Tin. EUV radiation 40 emitted from such a LPP source may be roughly isotropic and, in current DPP sources, is limited by the discharge electrodes to a source emission angle of about θ=60° or more from optical axis ASX. It is noted that the isotropy of the LPP source will depend on the type of LPP target, e.g., Sn droplets (low mass or high mass), Sn disc, Sn vapor, etc.

System 400 includes a cooled EUV GIC mirror system 20 such as described above. Cooled EUV GIC mirror system 20 is arranged adjacent and downstream of EUV radiation source 34, with collector axis AC lying along system axis AS. The GIC mirror assembly 100 of EUV GIC mirror system 20 collects EUV radiation 40 from EUV radiation source 34, and the collected radiation is directed to intermediate focus IF where it forms an intermediate source image 34'.

An illumination system 416 with an input end 417 and an output end 418 is arranged along system axis AS and adjacent and downstream of EUV GIC mirror system 20, with the input end adjacent the EUV GIC mirror system. Illumination system 416 receives at input end 417 EUV radiation 40 from source image 34' and outputs at output end 418 a substantially uniform EUV radiation beam 420 (i.e., condensed EUV radiation). Where system 400 is a scanning type system, EUV radiation beam 420 is typically formed as a substantially uniform line of EUV radiation at reflective reticle 436 that scans over the reticle.

A projection optical system 426 is arranged along (folded) system axis AS downstream of illumination system 416. Projection optical system 426 has an input end 427 facing illumination system output end 418, and an opposite output end 428. A reflective reticle 436 is arranged adjacent the projection optical system input end 427 and a semiconductor wafer 440 is arranged adjacent projection optical system output end 428. Reticle 436 includes a pattern (not shown) to be transferred to wafer 440, which includes a photosensitive coating (e.g., photoresist layer) 442.

In operation, the uniformized EUV radiation beam 420 irradiates reticle 436 and reflects therefrom, and the pattern thereon is imaged onto photosensitive surface 442 of wafer 440 by projection optical system 426. In a scanning system 400, the reticle image scans over the photosensitive surface 442 to form the pattern over the exposure field. Scanning is typically achieved by moving reticle 436 and wafer 440 in synchrony.

Once the reticle pattern is imaged and recorded on wafer 440, the patterned wafer 440 is then processed using standard photolithographic and semiconductor processing techniques to form integrated circuit (IC) chips.

Note that in general the components of system 400 are shown lying along a common folded axis AS in FIG. 18 for the sake of illustration. One skilled in the art will understand that there is often an offset between entrance and exit axes for the various components such as for illumination system 416 and for projection optical system 426.

Example GIC Mirror Cooling Assembly Parameters

Figure 19:
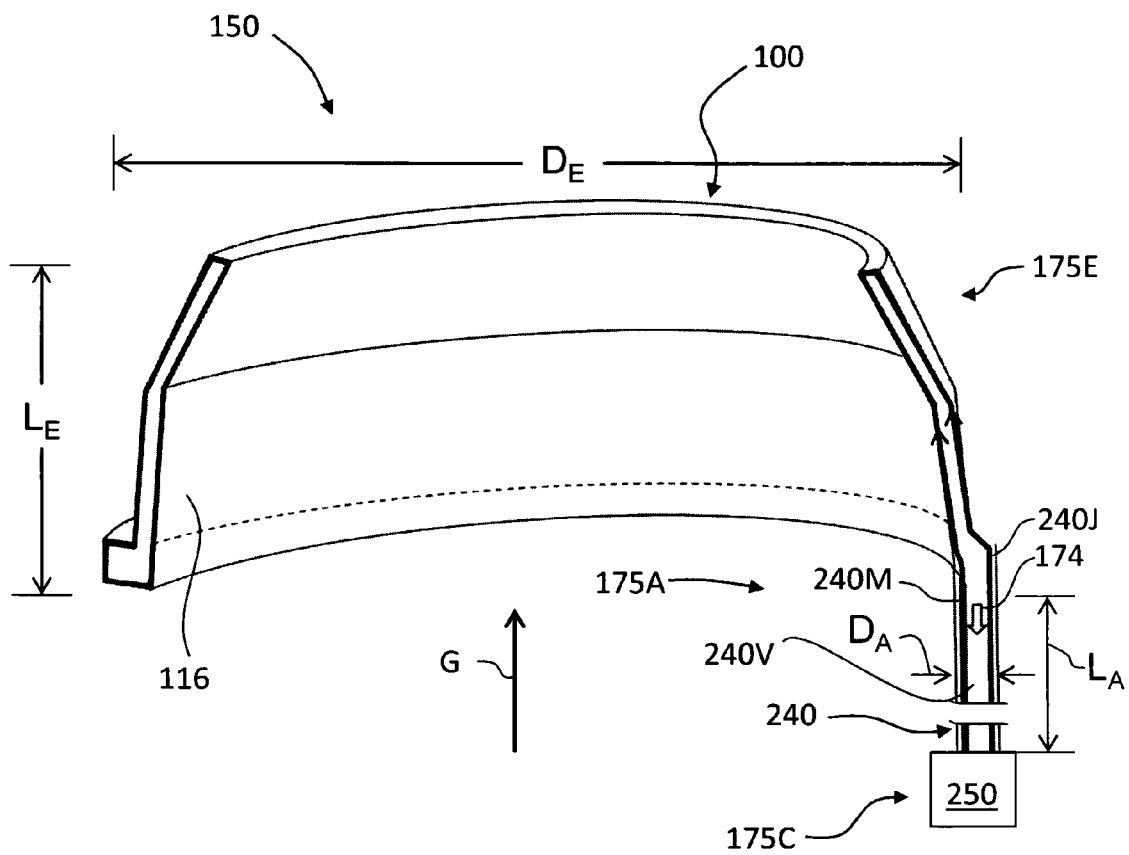
FIG. 19 is similar to FIG. 10 and illustrates example parameters for an example configuration for GIC mirror cooling assembly, with a general direction for the gravitational force shown to illustrate the optional gravitational assist to the capillary action driving the cooling fluid through the wicking material.

FIG. 19 is similar to FIG. 10 and is used to illustrate an example embodiment of GIC mirror cooling assembly 150 that illustrates an example set or range of design parameters that satisfy the key operational parameters (namely, the capillary, sonic, entrainment, and boiling limits) associated with a heat-pipe thermal management configuration such as used in the GIC mirror cooling assembly.

In FIG. 9 the direction of gravity G is shown in an example direction to indicate that gravitational assist occurs when the direction of G has a component in the direction of the capillary flow of cooling fluid 172. Other directions for gravity G are possible that have a component in the direction of capillary flow of cooling fluid 172.

In GIC mirror cooling assembly 150, GIC mirror assembly 100 defines evaporation region 175E. It is assumed that wicks 240M and 240J have a thickness of 1 mm and the width of the vapor channel 240V in chamber 180 is 3 mm. The assumed material for wicks 240M and 240J is Ni foam having a pore radius of 230 microns and a permeability of $3.8 \times 10^{-9} m^2$. The length of the GIC mirror assembly 100 is $L_E$=0.2 m and its diameter is $D_E$=0.4 m.

Adiabatic region 175A is defined by (adiabatic) transport conduit 240 having a vapor channel 240V of 10 mm radius surrounded by wicking layers 240M and 240J of 2 mm thickness and 0.5 mm walls, for a total diameter of $D_A$=25 mm. The length $L_A$ of transport conduit 240 is left as a variable. The configuration of GIC mirror cooling assembly 150 is considered to be similar to that shown in FIG. 6B, i.e., it has a gravitational-assist configuration. Transport conduit is fluidly connected to a condenser system 250 that defines condenser region 175C.

The operating temperature of a heat pipe is limited by the phase change temperature (boiling temperature) of cooling fluid 172, i.e., the temperature at which the coolant changes phase from liquid to vapor. In particular, for a given vapor pressure, the temperature of cooling fluid 172 at the surface of wick 240M or 240J cannot exceed the phase change temperature. Consequently, the ambient vapor pressure of cooling fluid 172 is used to set the operating temperature.

In the present example, it is assumed that cooling fluid 172 is water (e.g., distilled water) so that the cooling vapor 174 is water vapor. Then if the operating temperature (i.e., the phase change temperature) is 40° C. (313° K), the pressure within GIC mirror cooling assembly 150 should be reduced to 0.93 bar ($9.3 \times 10^4$ Pa). In this example, it is assumed that 5 kW of heat is absorbed by mirror surface 116 so that the average heat flux is approximately 2 W/cm². It is noted, however that a point-like EUV source 34 produces a non-uniform illumination mirror surface 116, resulting in larger thermal load on the portion of the mirror surface closest to the EUV source. Accordingly, an axially linear gradient of the thermal load from the leading to trailing edge of the mirror surface 116 is assumed, so that the maximum heat flux could be as high as 4 W/cm².

The mass flow within GIC mirror cooling assembly 150 is determined by the vaporization rate. This is the amount of cooling fluid 172 converted to cooling vapor 174 due to heat absorption. The cooling fluid flow rate $F_L$ is given by, $$F_L = \frac{\Psi}{h\rho_L} \quad (1)$$

Here $\Psi$=5 kW is the absorbed power, h is the latent heat of vaporization and $\rho_L$ is the water density. Using h=$2.36 \times 10^6$ J/kg and $\rho_L$=$10^{-3}$ kg/ml, the flow rate $F_L$=2.1 ml/s, which corresponds to a mass flow rate of $2.1 \times 10^{-3}$ kg/s. The density of the water vapor is given by the ideal gas equation, $$\rho_V = \frac{PW}{RT} \quad (2)$$

Here P=$9.3 \times 10^4$ Pa is the gas pressure, W=0.018 kg/mole is the molecular weight, R=8.314 J/mole-K and T=313 K is the temperature. The resulting density of the water vapor is $\rho_V$=0.64 kg/m³. For a mass flow rate of $2.1 \times 10^{-3}$ kg/s, the vapor flow rate is $F_V$=$3.3 \times 10^{-3}$ m³/s.

The cross-sectional area $A_V$ of the vapor channel 240V associated with chamber 180 in GIC mirror assembly 100 is $3.8 \times 10^{-3}$ m² and is $3.1 \times 10^{-4}$ m² in the adiabatic conduit 240. The corresponding flow velocities V for cooling vapor 174 are 0.87 and 10.6 m/s in chamber 180 and transport conduit 240, respectively.

The Reynolds number is defined as, $$Re = \frac{VD_H}{v_v} \quad (3)$$

where $D_H$ is the hydraulic diameter ($D_H$=6 mm for GIC mirror assembly 100 and 20 mm for the transport conduit) and $v_v$=$2 \times 10^{-5}$ m²/s is the kinematic viscosity of the vapor. Inserting these values into Eq. (3) one obtains Reynolds numbers of 260 for GIC mirror assembly 100 and 10600 for transport conduit 240. This indicates that the vapor flow is laminar in GIC mirror assembly 100 and turbulent transport conduit 240.

There are four key limits that must be observed to maintain uninterrupted flow of the coolant fluid 172 and coolant vapor 174. These are called the capillary, sonic, entrainment, and boiling limits. These limits are now explored in detail in connection with the present example.

Capillary Limit

The example configuration for GIC mirror cooling assembly 150 is such that the flow of cooling fluid is gravity assisted. This is accomplished, as explained above, by arranging the condenser region 175C so that it is located above the adiabatic region 175A, and locating the adiabatic region above the evaporator region 175E. This allows for combination of capillary pressure and gravitational force in the wicking layers 240M and 240J to drives the flow of cooling fluid 172. In this gravitation-assist configuration, it is necessary that the sum of the capillary and gravitational pressures be greater than the sum of the counter pressures produced by the viscous flow of both cooling fluid 172 and cooling vapor 174.

The capillary pressure is given by:

$$\Delta P_C = \frac{2\sigma \cos\theta}{r_C} \quad (4)$$

Here $\sigma$=$6.6 \times 10^{-2}$ N/m is the surface tension at the liquid-vapor interface, $\theta$=20 deg where $\theta$ is the contact angle between the water and the wicking material surface, and $r_C$=230·m is the pore radius of the Ni foam wick.

The pressure due to the gravitational force on the liquid is:

$$\Delta P_G = \rho_L g L \sin\alpha \quad (5)$$

Here g is the gravitational acceleration of 9.8 m/s² and $\alpha$ is the local angle of inclination (in the adiabatic region and/or in the evaporator) as measured from the horizontal.

The back pressure due to the viscous flow of cooling fluid 172 in the wick is given by Darcy's law:

$$\Delta P_L = -\frac{\mu L F_L}{K A_w} \quad (6)$$

Here $\mu$=$10^{-3}$ N-s/m² is the dynamic viscosity of water and K=$3.8 \times 10^{-9}$ m² is the permeability of the Ni foam wick. $A_w$ is the cross-sectional area of the wick ($A_w$=$1.25 \times 10^{-3}$ m² in the evaporator and $1.38 \times 10^{-4}$ m² in the adiabatic conduit).

The back pressure due to the viscous drag of the heat pipe walls on the vapor flow can be written as, $$\Delta P_V = -\frac{f L \rho_V V^2}{2 D_H} \quad (7)$$

Here f is the friction coefficient for the vapor at the wick interface. A typical value for a foam wick at large Reynolds number is f=2.

The pressures for GIC mirror assembly 100 and the transport conduit 240 are calculated using Equations (4) through (7), and the results are listed in Table 1, below. In Table 1, contributions to the differential pressure are calculated based on the GIC mirror assembly 100 arranged at an angle $\alpha$ of 60 degrees relative to the horizontal, and the adiabatic transport conduit 240 length L and inclination angle $\alpha$ are left to be determined in Table 1. Note that the appropriate parameter units are listed in the parameter column in Table 1.

TABLE 1

| PARAMETER | GIC Mirror Assembly L = 0.2 m, α = 60 deg | Transport Conduit |
|---|---|---|
| Flow velocity V (m/s) | 0.87 | 10.6 |
| Reynolds number Re | 260 | 10600 |
| Capillary pressure $\Delta P_C$ (Pa) | 540 | 540 |
| Gravitational pressure $\Delta P_G$ (Pa) | 1680 | 9800Lsinα |
| Liquid viscous pressure $\Delta P_L$ (Pa) | −88 | −4000L |
| Vapor viscous pressure $\Delta P_V$ (Pa) | −16 | −3600L |

The sum of the four pressure drops listed in Table I must be greater than zero to satisfy the capillary limit. It can be seen that this condition is easily met in GIC mirror assembly 100. In transport conduit 240, however, the following capillary limit condition must be satisfied:

$$540 + 9800L \sin\alpha - 4000L - 3600L > 0 \quad (8)$$

Figure 20:
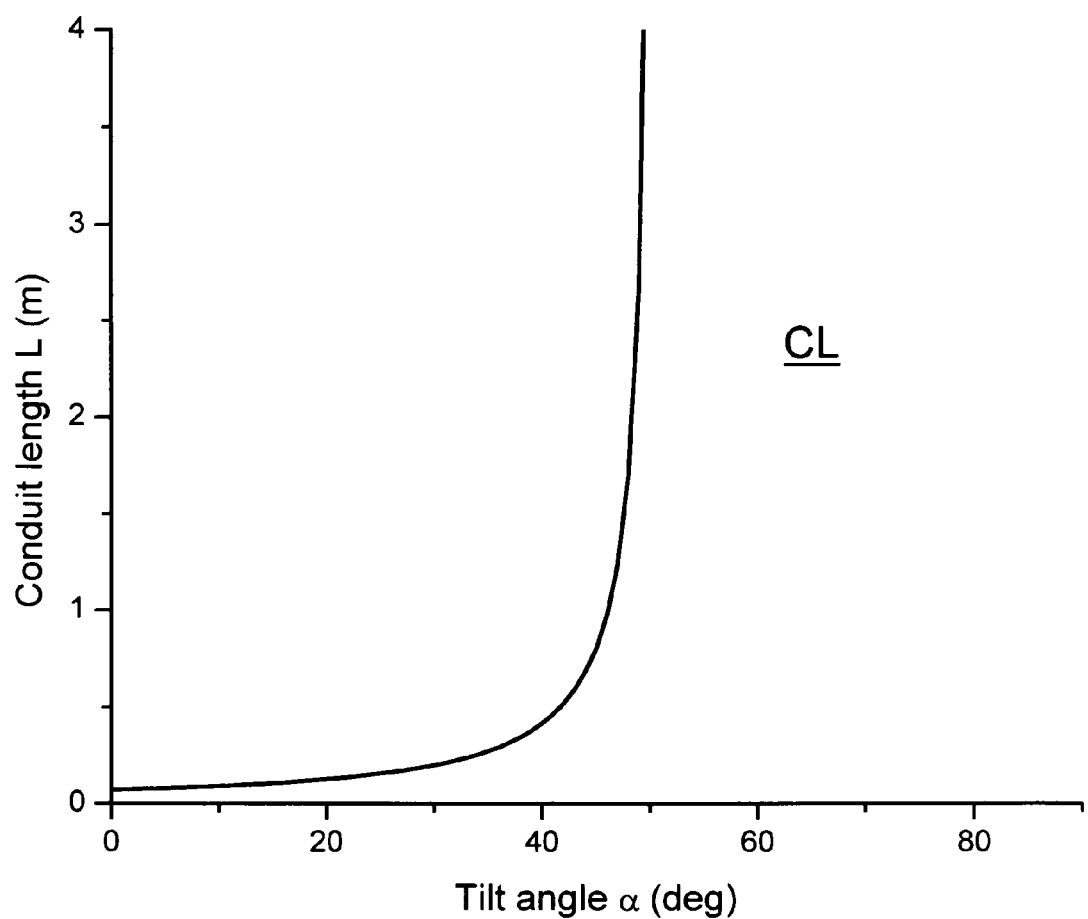
FIG. 20 plots the tilt angle α versus conduit length $L_4$ for the example GIC mirror cooling assembly, and shows the parameter space that satisfies the capillary limit.

It is evident that for any practical length L, transport conduit 240 preferably has some tilt, that is, some gravity assistance. The condition set forth in Equation (8) defines a region CL in the {L, α} parameter space shown the plot of FIG. 20. The region CL is where the capillary limit is satisfied. When the tilt angle α is greater than 50 degrees, transport conduit 240 can have essentially any reasonable length.

Sonic Limit

The sonic limit is defined where the flow velocity of the cooling vapor 174 reaches the speed of sound, and is given by:

$$V_{sonic} = \sqrt{\gamma RT} \quad (9)$$

Here γ=1.3 is the ratio of the specific heats of constant pressure and volume. For the present example, a sonic limit of $V_{sonic}$=58 m/s is obtained, which is much greater than the vapor flow velocities of V=0.87 m/s in GIC mirror assembly 100 and 10.6 m/s in transport conduit 240. Hence the GIC mirror cooling assembly 150 of this example satisfies the sonic limit.

Entrainment Limit

The entrainment limit is defined as the point at which the viscous shear forces due to the flow of cooling vapor 174 impede the flow of cooling liquid 172 in the wicks 240M and 240J. This occurs when the dynamic pressure in the vapor exceeds the capillary pressure in the wick. Recall that the capillary pressure is 540 Pa.

The dynamic pressure in the vapor is given by:

$$P_{dynamic} = \frac{1}{2}\rho_v V^2 \quad (10)$$

The dynamic pressures in our example are 0.24 Pa in the evaporator and 36 Pa in the adiabatic conduit. Since these values are very small compared to the capillary pressure we conclude that the operation of the heat pipe is well below the entrainment limit.

Boiling Limit

The boiling limit occurs when the vaporization rate of the cooling fluid 172 exceeds the diffusion rate of the cooling vapor 174 out of wicks 240M and 240J. In this case gas bubbles are nucleated and grow in the wick, impeding the flow of cooling fluid 172. The conditions for boiling depend on the detailed structure of the wick material and its interaction with cooling fluid 172. In general, however, it has been observed that boiling does not occur for heat fluxes less than 10 W/cm². It is estimated that GIC mirror assembly 100 will experience a maximum heat flux of ~4 W/cm² in a commercial EUV lithography setting, which is anticipated to be safely below the boiling limit.

It will be apparent to those skilled in the art that various modifications and variations can be made to the present invention without departing from the spirit and scope of the invention. Thus it is intended that the present invention cover the modifications and variations of this invention provided they come within the scope of the appended claims and their equivalents.

What is claimed is:

1. A grazing incidence collector (GIC) cooling assembly operable when heat is applied to the assembly, comprising:
    a GIC mirror shell having a reflective inner surface and an opposite outer surface;
    a jacket having an inner surface and interfaced with the GIC mirror shell to define a chamber with leading and trailing ends, with a vapor conduit fluidly connected to the chamber at the trailing end;
    at least one wicking layer disposed immediately adjacent and in thermal contact with the GIC mirror shell outer surface;
    a conduit that supports the at least one wicking layer and that defines a vapor conduit; and
    a condenser system fluidly connected to the conduit and to the at least one wicking layer, with the at least one wicking layer configured to support the capillary flow of a cooling fluid from the condenser system through the conduit and through the chamber, and a counter-flow of cooling-fluid vapor through the chamber, through the vapor conduit and to the condenser system when sufficient heat is applied to the assembly leading end.

2. The GIC mirror cooling assembly of claim 1, further comprising a second wicking layer disposed immediately adjacent and in thermal contact with the jacket inner surface.

3. The GIC mirror cooling assembly of claim 1, wherein the cooling fluid includes at least one of water, methanol, ethanol and ammonia.

4. The GIC mirror cooling assembly of claim 1, wherein the GIC mirror shell and the jacket include at least one compliant interface therebetween.

5. The GIC mirror cooling assembly of claim 4, wherein the compliant interface includes a compliant member.

6. The GIC mirror cooling assembly of claim 5, wherein the compliant member includes at least one of a hinge, a flexure, a bellows, a gasket and an epoxy.

7. The GIC mirror cooling assembly of claim 4, wherein the compliant interface includes a welded joint or a brazed joint.

8. The GIC mirror cooling assembly of claim 1, wherein the at least one wicking layer comprises a wicking material selected from the group of wicking materials comprising: metal foam, vitreous foam, reticulated plastic, reticulated polymer, woven plastic and woven polymer.

9. The GIC mirror cooling assembly of claim 1, wherein the least one wicking layer has a thickness in the range from 20 microns to 2 mm.

10. The GIC mirror cooling assembly of claim 1, wherein the chamber has a width in the range between 1 mm and 8 mm.

11. The GIC mirror cooling assembly of claim 1, further comprising an actively cooled thermal shield operably arranged adjacent the assembly leading end.

12. The GIC mirror cooling assembly of claim 1, wherein the condenser unit is configured to provide cooling fluid to the wicking layers and to receive vapor from the conduit and condense the vapor to form said cooling fluid while removing latent heat of vaporization attendant with said condensation.

13. The GIC mirror system according to claim 1, further comprising multiple GIC cooling assemblies fluidly connected to the condenser system, wherein the GIC mirror shell mirrors are configured in a nested configuration.

14. The GIC mirror assembly of claim 1, further comprising the condenser system being arranged relative to the chamber such that the cooling fluid flow is gravity assisted.

15. An extreme ultraviolet (EUV) lithography system for illuminating a reflective mask, comprising:
a source of EUV radiation;
the cooled GIC mirror system of claim 1 configured to receive the EUV radiation and form collected EUV radiation; and
an illuminator configured to receive the collected EUV radiation and form condensed EUV radiation for illuminating the reflective reticle.

16. The EUV lithography system of claim 15 for forming a patterned image on a photosensitive semiconductor wafer, further comprising:
a projection optical system arranged downstream of the reflective reticle and configured to receive reflected EUV radiation from the reflective reticle and form therefrom the patterned image on the photosensitive semiconductor wafer.

17. A method of evaporatively cooling a grazing incidence collector (GIC) cooling assembly, comprising:
interfacing a GIC mirror shell having an outer surface with a jacket having an inner surface to form a structure having a chamber, a leading end and a trailing end;
providing opposing conformal wicking layers on the respective mirror outer surface and jacket inner surface to define a heat pipe in the chamber;
exposing the structure to radiation from an extreme ultraviolet (EUV) radiation source that emits EUV radiation and other background radiation, thereby heating the structure and initiating operation of the heat pipe by sufficiently heating a cooling fluid carried by the wicking layers to produce vapor; and
removing the vapor from the chamber at the chamber trailing end.

18. The method of claim 17, further comprising:
condensing the removed vapor at a remote location to form cooling fluid therefrom, and removing latent heat of vaporization associated with said condensing.

19. The method of claim 17, further comprising providing the capillary flow of cooling fluid from a cooling fluid reservoir to the chamber so that the capillary flow is assisted by gravity.

20. A method of cooling a grazing incidence collector (GIC) cooling assembly via an evaporative cooling scheme, comprising:
interfacing a GIC mirror shell having an outer surface with a jacket having an inner surface to form a structure having a chamber and a leading end and a trailing end;
operatively configuring at least one wicking layer within the chamber to define a heat pipe in the chamber;
initiating an evaporative cooling cycle to draw cooling fluid in a first direction in the at least one wicking layer via capillary action and to create within the chamber a vapor from the cooling fluid that travels in a second direction opposite the first direction; and
removing the vapor from the chamber at the chamber trailing end.

21. The method of claim 20, further comprising initiating the evaporative cooling cycle using at least one of an exogenous heat source and an EUV radiation source.

22. The method of claim 20, further comprising removing latent heat from the removed vapor using a reservoir configured to hold condensed cooling fluid, the reservoir being in thermal contact with a heat exchanger.

23. The method of claim 20, further comprising orienting the first direction so that it has a component in the direction of gravity.

* * * * *